United States Patent
Vampola

(10) Patent No.: US 10,400,958 B2
(45) Date of Patent: Sep. 3, 2019

(54) ADDRESSABLE COLOR CHANGEABLE LED STRUCTURE

(71) Applicant: Lumileds LLC, San Jose, CA (US)

(72) Inventor: Kenneth John Vampola, Los Altos, CA (US)

(73) Assignee: LUMILEDS LLC, San Jose, CA (US)

( * ) Notice: Subject to any disclaimer, the term of this patent is extended or adjusted under 35 U.S.C. 154(b) by 49 days.

(21) Appl. No.: 15/858,058

(22) Filed: Dec. 29, 2017

(65) Prior Publication Data

US 2018/0187839 A1 Jul. 5, 2018

Related U.S. Application Data

(60) Provisional application No. 62/440,935, filed on Dec. 30, 2016.

(51) Int. Cl.
| | |
|---|---|
| F21V 9/00 | (2018.01) |
| F21K 9/20 | (2016.01) |
| F21V 23/00 | (2015.01) |
| F21K 9/64 | (2016.01) |
| F21K 9/69 | (2016.01) |

(52) U.S. Cl.
CPC .......... *F21K 9/20* (2016.08); *F21K 9/64* (2016.08); *F21K 9/69* (2016.08); *F21V 23/001* (2013.01)

(58) Field of Classification Search
None
See application file for complete search history.

(56) References Cited

U.S. PATENT DOCUMENTS

| | | | |
|---|---|---|---|
| 6,867,795 B1 * | 3/2005 | Wareberg | H01L 27/153 257/81 |
| 8,314,558 B2 | 11/2012 | Dassanayake et al. | |
| 8,384,097 B2 | 2/2013 | Yan | |
| 2016/0273716 A1 | 9/2016 | Tarsa et al. | |
| 2016/0284283 A1 | 9/2016 | Kurita | |
| 2017/0005240 A1 | 1/2017 | Horie | |

FOREIGN PATENT DOCUMENTS

WO 2016/050872 4/2016

* cited by examiner

*Primary Examiner* — Vip Patel

(57) ABSTRACT

A light-emitting device package includes a metalized substrate, a light-emitting diode (LED) die, and a single primary optic. The metalized substrate includes a top surface, pads on the top surface, and traces extending from the pads. The LED die is mounted on the pads of the metalized substrate. The LED die includes individually addressable segments. Each segment includes one or more junctions. The primary optic is located over the LED die.

33 Claims, 15 Drawing Sheets

ADDRESSABLE COLOR CHANGEABLE LED STRUCTURE

FIELD OF THE INVENTION

The present disclosure relates to color changing light-emitting device packages.

BACKGROUND

Addressable Color Changeable LED Structure

There are several ways to construct a color changing light-emitting device package. A number of individual light-emitting diodes (LEDs) of different colors can be placed under a single primary optic. However, this presents difficulties in mixing the colors. If there is no mixing, some primary optics will project the different colors into different directions. When mixing is added, it makes the effective source size larger or compromises the design of the primary optics. The result is that either the beam control is worsened or a larger primary optic is required. These affect the overall performance, form factor, and price of the package.

Alternatively, a number of individual LEDs of different colors can be each placed under its own primary optic. In this case, the beams may not completely overlap, especially at close distances. This can create a color artifact near the border of shadows. Also, this introduces a limitation on the optical design. More than one primary optic is needed and this may not be preferred aesthetically. This is the current solution for color-changing flash modules.

A LED light source based on LED pixels has been discussed for displays, such as a low power addressable LED arrays for color changeable displays. U.S. Pat. No. 9,041,025 discloses LED pixels arranged in groups of four pixels, with the LEDs emitting a single color of light for all pixels. A mold positioned over the LED pixels accepts phosphors for the individual LED pixels in each group. The phosphors in the mold transmit at least three (3) primary colors for respective ones of the LED pixels in each group. A fourth LED pixel in the group can transmit white light.

High Power Addressable LED Structure

A LED light source based on addressable individual or groups of LED pixels that can be turned on or off has been discussed.

A number of individual LEDs can be placed near each other in an array, each under their own primary optic. However, this requires a large number of LEDs and primary optics, and will take a lot of space.

Osram's Micro Advanced Forward-lighting System (µAFS) concept discloses a multi pixel flip chip LED array directly mounted to an active driver integrated circuit (IC). A total of 1024 pixels can be individually addressed through a serial data bus. Several of these units can be integrated in a prototype headlamp to enable advanced light distribution patterns in an evaluation vehicle.

Vehicle manufacturers have realized the advantages of selectively addressable LED arrays for headlights. For example, U.S. Pat. No. 8,314,558 discloses a vehicle headlamp having a plurality of LEDs positioned into an array. The array has at least one row and at least two columns with each LED positioned at an intersection of a row and a column. A LED is illuminated by selectively applying a signal to the row and a signal to the column corresponding to the position of the LED.

High Tunability LEDs with Phosphors Deposited on Wafer

It is difficult to coat different types of phosphors on LED pixels on the same wafer or tile when the LED pixels are in close proximity to each other. Phosphors for one LED pixel may spill over and mix with phosphors of a neighboring LED pixel. Furthermore, light crosstalk between phosphors of neighboring LED pixels varies the color endpoints between packages and reduces the range of color tunability between the color endpoints.

Improved Phosphor Deposition System for LEDs

The use of multi-chip LED fixtures to improve color intermixing has been discussed. For example, Acclaim Lighting describes a color mixing application using a single lens to produce a homogenized beam with blended color and minimal color halos or shadowing. Such multi-chip packages are available from Cree, Osram, Prolight Opto Technology, and Opto Tech Corp.

SUMMARY

Addressable Color Changeable LED Structure

Some examples of the present disclosure provide a color changing light-emitting device package. Since there is only one LED die in the package, only one optic is needed.

The LED die is made of a number of segments, each emitting a different color of light. The amount of light emitted from each segment can be changed. The result is a change in the average color of the whole LED die. The segments are placed close together to enable efficient color mixing in the optic outside of the LED die. This means that better optical control can be achieved with a smaller optic, which reduces cost and form factor.

The segments can consist of a single junction or multiple junctions. In a simple example, a LED die is divided into two segments of different colors, each consisting of an individually controlled junction. In a more complicated example, a LED die is divided into two segments of different color, each consisting of nine (9) junctions in parallel or in series.

The multiple junctions in a single segment can be continuous or discontinuous. For example, in the case of two different color segments each consisting of nine (9) individual junctions, the junctions of different segments (colors) may be interspersed (placed among each other) randomly or in a regular pattern. A regular pattern may be a checkerboard pattern with alternating color junctions, serpentine segments that spiral outward and encircle each other, or concentric circular segments of different (alternating) color junctions.

The segments define the borders of the color tunable region of the LED die. If there are two segments of different colors, then the average color can be tuned to either of these endpoint colors or any color on a straight line between the endpoint colors. If there are three segments of different colors, the color gamut is defined by a triangle with corners having the colors of the individual segments. More segments will result in more shapes in the color space. In some examples, each segment may have a different spectral content. This means that all segments may have the same color but some might have different color rendition index (CRI) or R9 (red) values.

The junctions of each color should be small and preferably interspersed randomly or in a regular pattern. From an application's viewpoint, it is better to have the colors interspersed like a checkerboard, rather than have a few large junctions of all one color. The size of a single junction of a color segment should be small. From an application's viewpoint, it is better to have the LED die divided into a 50×50 checkerboard grid of two colors than a 2×2 grid of two colors. On the other hand, the grid with fewer, larger elements is easier to manufacture. In some examples, an LED die includes individual colored junctions of about 50 to 200 micrometers (μm) in width/height and has a grid size on the order of 4 to 20 elements×4 to 20 elements. In other examples, an LED die includes individual colored junctions of about 50 to 500 μm in width/height. The size or number of individual junctions does not need to be uniform.

The electrodes of the LED die are routed to the perimeter, where they can be accessed by one or more drivers. There are a number of ways to wire this.

The junctions may share a common cathode. The anode of each junction is individually routed to the perimeter. The cathode connection can be made on the LED level (when the junctions are not physically separated) or on the package level.

The junctions may share a common anode. The cathode of each junction is individually routed to the perimeter. The anode connection can be made on the LED level (when the pixels are not physically separated) or on the package level.

All the junctions may be connected in series. The traces that connect each pair of junctions are also routed to the perimeter, as well as the two unpaired connections. In this way, any junction can be shorted out, turning it off. Dimming can still be achieved with a pulse width modulation scheme.

One group of junctions may be connected using any of the above methods, and other groups are separately connected using any of the above methods. For example, the first row of junctions can be connected in series, and the second row of junctions can also be connected in series but in a different string.

All of the above routing may apply to the LED die as a whole, or may apply to the junctions of a certain segment (color). For instance, all of the junctions of one color may be in a series string, and all of the segments of a different color may be in a separate series string.

All LED junctions of a certain segment (color) may be connected in parallel. For instance, all of the junctions of color 1 can be in a single parallel string, and the junctions of color 2 can be a separate parallel string.

All traces are routed to the perimeter. This offers ultimate driver flexibility, since any of the above configurations can be made outside of the package.

High Power Addressable LED Structure

Some examples of the present disclosure provide a light-emitting device package with a single LED die having addressable junctions. Each junction can be addressed either individually or in groups (segments). The junctions can be independently turned on, turned off, or "dimmed" to an intermediate value. This enables beam steering, spot reduction, highlighting and dynamic effect features.

When the source package is imaged through a secondary imaging optic, the beam pattern is changed. The changing beam pattern can be used in a number of ways. The beam can be steered from one location to another. Parts of the beam can be turned up to highlight a location. Parts of the beam can be turned down or off to reduce or eliminate light in a place where it is not wanted. For instance, parts of the beam can be turned down or off to reduce glare. It can also save energy by only generating the light that is needed. A dynamic effect can be created. This may highlight something, illuminate a moving object, or may be used for artistic effect.

The junctions may be completely isolated from each other, or they can share a common cathode or common anode.

The junctions are arranged as closes as possible while still enabling phosphor deposition with an acceptable amount of phosphor spill-over from adjacent junctions and light crosstalk. For example, the active regions of two adjacent junctions are 1 to 100 μm apart, such as 37.9 μm apart in one direction and 25.9 μm apart in an orthogonal direction. This may be accomplished by attaching the junctions at once, as a monolithic array, still all joined together. The junctions may be separated after the attach process, such as through a laser-liftoff of their growth substrate.

The array may be used as-is or a wavelength converting layer can be applied. This may be used to make an array of white pixels.

Traces to the junctions are routed to the perimeter, where they may be accessed by one or more drivers.

As described above, some examples of the present disclosure enable low cost beam steering without requiring large separate packages with individual optical elements. The light-emitting device package allows the use of a ceramic substrate, which provides more freedom in choosing the cost, thermal expansion coefficient (influencing integration into a system), thermal resistance, and mechanical robustness.

Some examples of the present disclosure use smaller numbers of LEDs to achieve a pixilated light source. For instance, if one desires 18 pixels, the discrete LED case will require 18 LEDs. If each LED must be 0.5 $mm^2$, then the total LED area is 9 $mm^2$. Compare this to a single multi-junction LED of only 2 $mm^2$.

Some examples of the present disclosure use fewer optics, fewer attach steps, and fewer optic alignment steps. There is one LED die attach and one optic, compared to many LEDs to attach and many optics. This also results in a lower cost for the light-emitting device package, especially in cases where large numbers of LED dies would result in underdriving the LEDs.

The size of the optics and source is also smaller. In the discrete LED case, a large array of optics is required whereas the light-emitting device package uses only one optic. The size of the optic may be larger than what is required for a single standard LED but it is not as large as the array of optics. In some applications, there is not enough space for a large array of optics. In some applications, there is an aesthetic value in reducing the size of the combined optics.

High Tunability LEDs with Phosphors Deposited on Wafer

Some examples of the present disclosure provide discrete strings, lines, or blocks of a transparent conductor such as antimony tin oxide (ATO), indium tin oxide (ITO), or silver nanowires capable of being deposited on a growth substrate of an LED die with multiple junctions. Each grouping of transparent conductor can be deposited in separate, distinct lines or blocks. Complex curved, circular, or winding layouts are possible.

With application of a voltage to a particular transparent conductor string, phosphors may be electrophoretically deposited only on the transparent conductor. Varying voltage duration will correspondingly vary amount and thickness of deposited phosphors.

Separation of phosphor lines may be adjusted by increasing or decreasing width of underlying transparent conductor string.

Some examples of the present disclosure provide for low cost wafer level deposition of phosphors on sapphire. Multiple types and thicknesses of phosphors can be used. When singulating the wafer into LED dies, variation due to phosphor crosstalk is minimized to improve color tunability.

Improved Phosphor Deposition System for LEDs

In some examples of the present disclosure, phosphors are applied by electrophoretic deposition (EPD) to specific junctions. A voltage can be applied to specific groups of electrically connected junctions. Discrete strings, lines, blocks, complex curves, circular, winding, or checkerboard layouts are possible. Varying the voltage during the deposition or the duration of the deposition may correspondingly vary amount and thickness of deposited phosphors.

To reduce risk of electrical sparking between closely spaced junctions during EPD, adjacent junctions can be held at a non-zero voltage. For example, a first string of junctions can be held at 800 volts during EPD while adjacent junctions are held at 400 volts rather than 0 volts.

If a sharp transition in amount, type, or thickness of phosphor is desired between closely spaced junctions, adjacent junctions can also be held at opposite voltage during EPD. For example, a first string of junctions can be held at 800 volts during EPD while adjacent junctions are held at −400 volts rather than 0 volts.

In some examples, antishock or insulating layers can be deposited between junctions prior to high voltage EPD.

BRIEF DESCRIPTION OF THE DRAWINGS

In the drawings:

FIG. 1-2 is a cross-sectional view of the LED die of FIG. 1 in some examples of the present disclosure.

FIGS. 2 and 3 illustrate the assembly of a light-emitting device package in some examples of the present disclosure.

FIG. 15-1 illustrates another pattern of transparent conductors on a growth substrate for forming wavelength converters using EPD in some examples of the present disclosure.

FIG. 15-2 illustrates wavelength converters having smaller footprint than the underlying junctions in some examples of the present disclosure.

FIG. 15-3 illustrates wavelength converters of different colors abutting each other in some examples of the present disclosure.

FIGS. 19-1 and 19-2 illustrate the placement of junctions in the LED die of FIG. 1-2 on the metalized substrate of FIG. 17 in some examples of the present disclosure.

Use of the same reference numbers in different figures indicates similar or identical elements.

DETAILED DESCRIPTION

Figure 1:
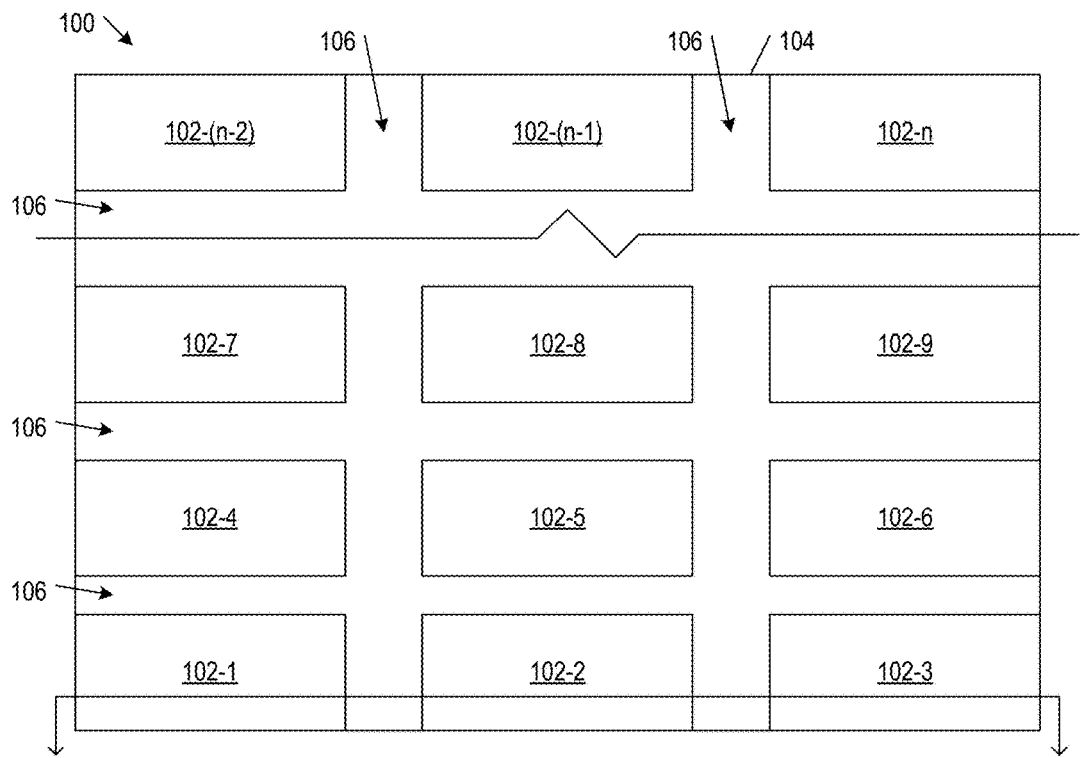
FIG. 1-1 is a top view of a light-emitting diode (LED) die in some examples of the present disclosure.

FIG. 1-1 is a top view of a light-emitting diode (LED) die 100 in some examples of the present disclosure. LED die 100 may be a segmented or multi-junction LED die. LED die 100 includes an array of junctions 102-1, 102-2, ..., and 102-$n$ (collectively as "junctions 102" or individually as a generic "junction 102") formed on a growth substrate 104. The array of junctions 102 in LED die 100 is not limited to any size or shape. Trenches 106 down to growth substrate 104 surround junctions 102 to completely electrically insulate them from each other. Trenches 106 may be formed by wet etch, dry etch, mechanical saw, laser scribe, or another suitable technique.

Figures 1, 2:
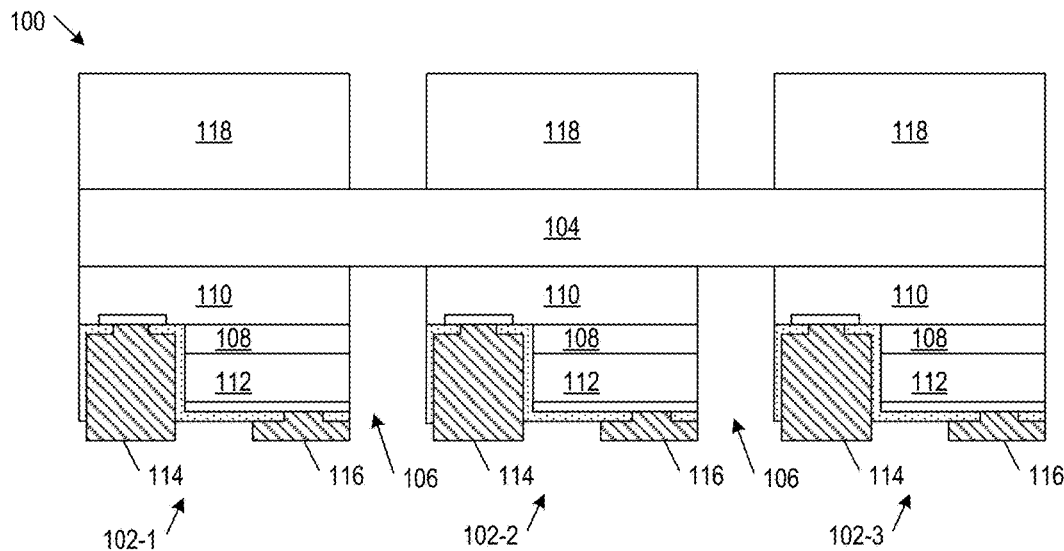
Figure 2:
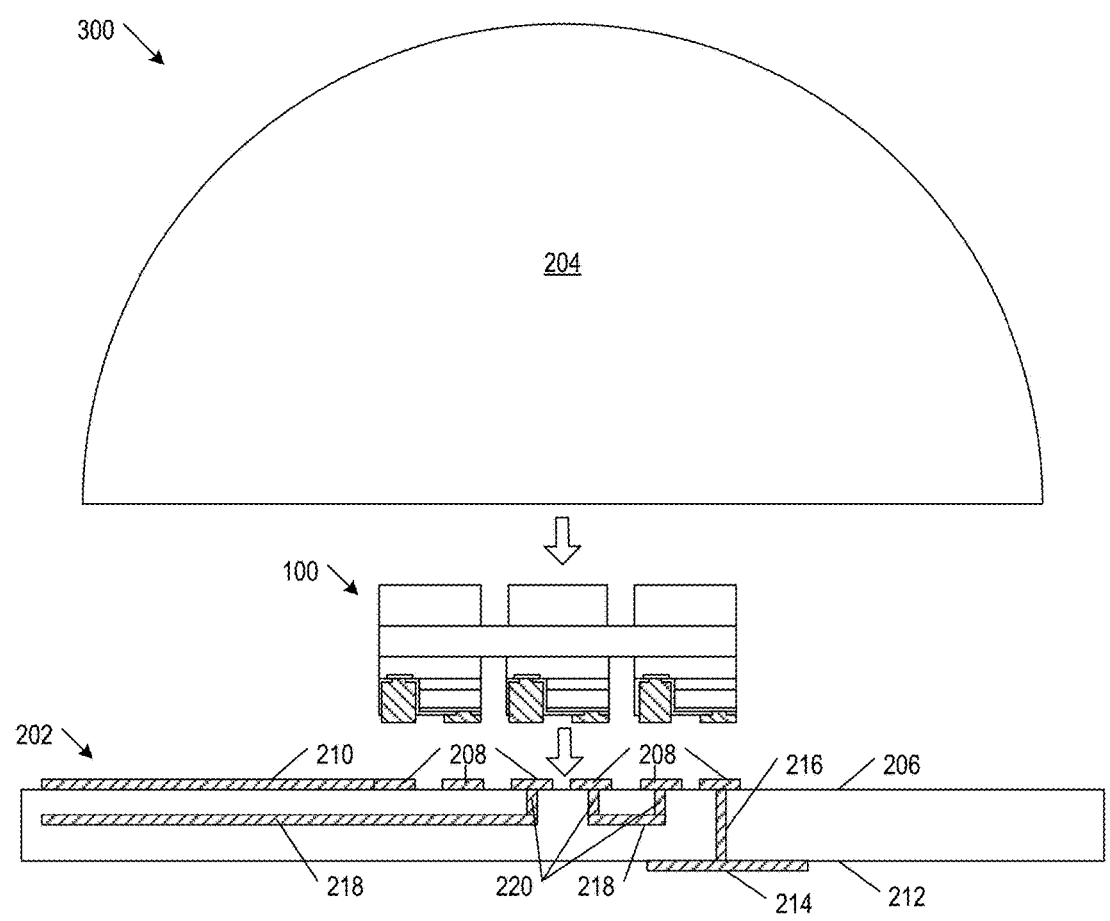

FIG. 1-2 is a cross-sectional view of LED die 100 in some examples of the present disclosure. Each junction 102 has a semiconductor structure including an active region 108 between an n-type semiconductor layer 110 and a p-type semiconductor layer 112. Each junction 102 has a cathode 114 coupled to its n-type semiconductor layer 110 by an ohmic p-contact through an opening in an insulator (dielectric) layer, and each junction 102 has an anode 116 coupled to its p-type semiconductor layer 112 by an ohmic n-contact through an opening in the insulator layer. Surface treatment may be performed on growth substrate 104, such as photo-electrochemical (PEC) etching or mechanical roughening, or a thin film of anti-reflective coating may be applied. In some examples, growth substrate 104 is removed from LED die 100 after LED die 100 is mounted on another mechanical support.

LED dies 100 are formed on a growth wafer. The layers for the semiconductor structure of LED dies 100 are grown on the growth wafer, followed by the ohmic contacts and then the cathodes and the anodes. Trenches 106 are formed in these layers down to the growth wafer to create junctions 102 in each LED die 100. Individual LED dies 100 are singulated from the resulting device wafer.

LED die 100 includes individual wavelength converters 118. Wavelength converters may be phosphor layers or ceramic phosphor plates. Each wavelength converter 118 is located over a different junction 102. Wavelength converters 118 are formed on growth substrate 104 or directly on junctions 102 when growth substrate 104 has been removed from LED die 100 after LED die 100 is mounted on another mechanical support. Wavelength converters 118 are made of a number of different materials to generate different colors of light, such as whites of different correlated color temperatures (CCTs) or primary colors of red, green, and blue. Instead of individual wavelength converters 118, a single continuous wavelength converter of the same material may be used to generate a single color of light. Wavelength converters 118 may also be omitted so junctions 102 emit their native color(s) of light based on their bandgap energies.

Wavelength converters 118 may be formed on the growth wafer before LED dies 100 are singulated from the device wafer, or on growth substrates 104 after LED dies 100 are singulated from the device wafer. Alternatively, wavelength converters 118 are formed directly on junctions 102 in LED dies 100 after growth substrates 104 have been removed from LED dies 100 after LED dies 100 are mounted on other mechanical supports.

Figure 3:
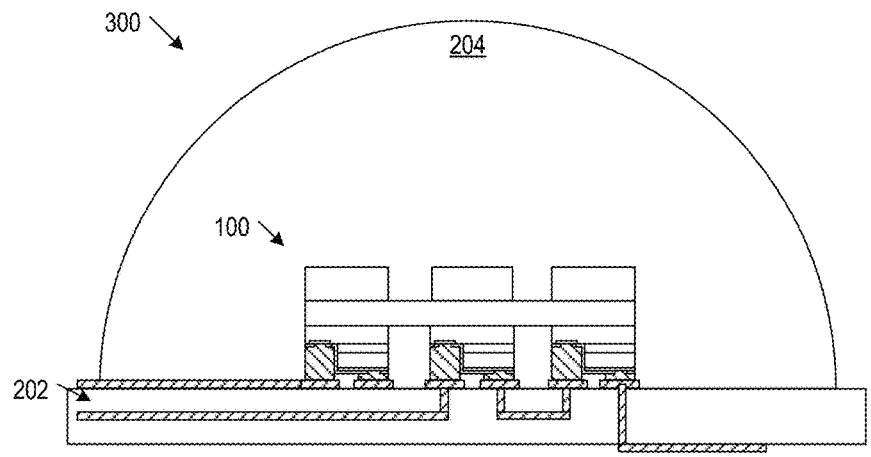

FIGS. 2 and 3 illustrate the assembly of a monochromatic or color changing light-emitting device package 300 in some examples of the present disclosure. Package 300 includes a LED die 100, a metalized substrate 202, and a primary optic 204. LED die 100 is mounted on metalized substrate 202, and primary optic 204 is mounted over LED die 100 on metalized substrate 202. Instead of mounting LED die 100 on metalized substrate 202, individual junctions 102 singulated from a device wafer maybe picked and placed on metalized substrate 202.

Metalized substrate 202 is a single-layer or multi-layer tile, which may be made of aluminum nitride ceramic, aluminum oxide ceramic, or another suitable material. Metalized substrate 202 has a top surface 206, top pads 208 on top surface 206, top traces 210 on top surface 206, and a bottom surface 212. Top pads 208 are arranged about the center of top surface 206 to receive the electrodes (cathodes 114 and anodes 116) of junctions 102 in LED die 100. Cathodes 114 and anodes 116 are attached to top pads 208 by gold-gold interconnect, large-area gold-gold interconnect, solder, or another suitable interconnect. Top traces 210 connect to top pads 208 and fan out to the perimeter of metalized substrate 202 where top traces 210 can be connected to external driving circuitry. Top traces 210 may connect certain top pad 208 from different junctions 102 in series, in parallel, or a combination thereof.

When metalized substrate 202 is a multi-layer tile, it may include bottom pads 214 on bottom surface 212 and vias 216 that connect top pads 208 to bottom pads 214. Metalized substrate 202 may also include lower level (buried) traces 218 and vias 220 that connect top pads 208 to traces 218. Traces 218 may connect certain top pad 208 from different junctions 102 in series, in parallel, or a combination thereof. Traces 218 may also fan out to the perimeter of metalized substrate 202 where they can be connected to external driving circuitry.

Primary optic 204 is a silicone hemispheric lens or flat window molded over LED die 100 on metalized substrate 202. Alternatively, primary optic 204 is a preformed silicone or glass hemispheric lens or flat window mounted over LED die 100 on metalized substrate 202. Primary optic 204 may include scattering particles. Although shown mounted on metalized substrate 202, primary optic 204 may be spaced apart from metalized substrate. Typically, the primary optic is used to tune light extraction efficiency and radiation pattern of an LED. For a color changing light-emitting device package, the primary optic may also be used to tune the color saturation and color cross-talk of the package. For example, while a hemispheric lens may extract more light from LED die 100, a flat window may create a more saturated color by recycling more of the pump (e.g., blue) light from LED die 100 through wavelength converters 118. Primary optic 204 may be shaped to increase color saturation and reduce cross-talk between wavelength converters 118 of different materials. In some examples, primary optic 204 may be a beam homogenizer, such as a microlens array.

Figure 4:
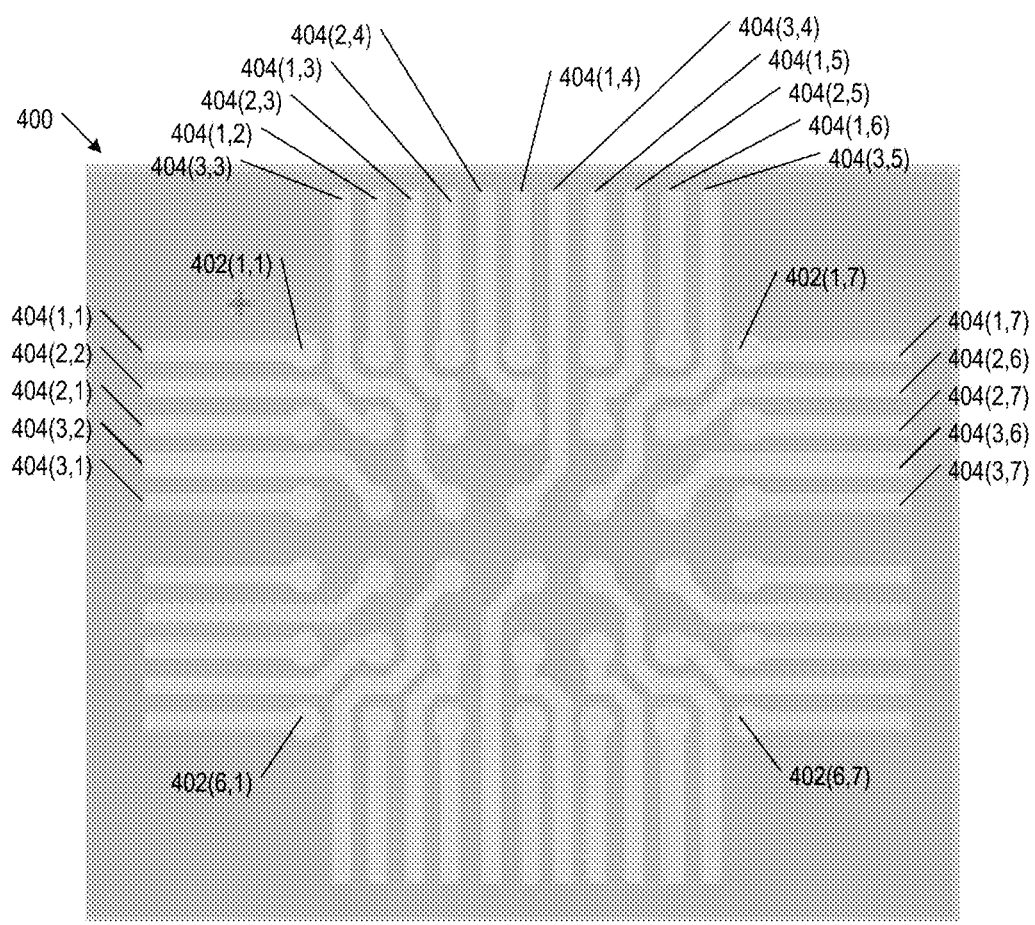
FIG. 4 is a top view of a metalized substrate in some examples of the present disclosure.

FIG. 4 is a top view of a metalized substrate 400 in some examples of the present disclosure. Metalized substrate 400 may be metalized substrate 202 in package 300 (FIG. 3). Metalized substrate 400 is a single-layer tile. Metalized substrate 400 includes a 6 by 7 array of top pads 402 (only four are labeled), and top traces 404 connected to top pads 402. Top traces 404 fan out to the perimeter of the metalized substrate 400. To help understand the layout of top pads 402 and top traces 404, a specific pad is identified by its row and column numbers, and a specific trace is identified by its pad's row and column numbers. For example, the first (leftmost) pad in the first (top) row is identified as 402(1,1), and the trace to pad 402(1,1) is identified as 404(1,1). Cardinal directions are also used to describe the paths of top traces 404.

In the first row of pads 402, traces 404(1,1) and 404(1,7) fan out to the west and the east, respectively, toward the perimeter of metalized substrate 400. Traces 404(1,2) to 404(1,6) fan out to the north toward the perimeter of metalized substrate 400.

In the second row of pads 402, traces 404(2,1) and 404(2,7) fan out to the west and the east, respectively, toward the perimeter of metalized substrate 400. Trace 404(2,2) fans out diagonally to the northwest and then to the west to pass between pads 402(1,1) and 402(2,1). Trace 404(2,3) fans out to the north, then diagonally to the northwest, and finally to the north to pass between pads 402(1,2) and 402(1,3). Trace 404(2,4) fans out to the north, then diagonally to the northwest, and finally to the north to pass between pads 402(1,3) and 402(1,4). Trace 404(2,5) fans out to the north, then diagonally to the northeast, and finally to the north to pass between pads 402(1,5) and 402(1,6). Trace 404(2,6) fans out diagonally to the northeast and then to the east to pass between pads 402(1,7) and 402(2,7).

In the third row of pads 402, traces 404(3,1) and 404(3,7) fan out to the west and the east, respectively, toward the perimeter of metalized substrate 400. Trace 404(3,2) fans out diagonally to the northwest and then to the west to pass between pads 402(2,1) and 402(3,1). Trace 404(3,3) fans out diagonally to the northwest and then to the north to pass between pads 402(2,2) and 402(2,3). Trace 404(3,3) continues diagonally to the northwest, to the west to pass between pads 402(1,2) and 402(2,2), diagonally to the northwest, and finally to the north to pass between pads 402(1,1) and 402(1,2). Trace 404(3,4) fans out diagonally to the northeast, to the north to pass between pads 402(2,4) and 402(2,5), and continues to the north to pass between pads 402(1,4) and 402(1,5). Trace 404(3,5) fans out diagonally to the northeast and then to the north to pass between pads 402(2,5) and 402(2,6). Trace 404(3,5) continues diagonally to the northeast, to the east to pass between pads 402(1,6) and 402(2,6), diagonally to the northeast, and finally to the north to pass between pads 402(1,6) and 402(1,7). Trace 404(3,6) fans out diagonally to the northeast and then to the east to pass between pads 402(2,7) and 402(3,7).

Traces 404 for pads 402 in the fourth, the fifth, and the sixth rows mirror the configuration of traces 404 in the third, the second, and the first rows.

Figure 5:
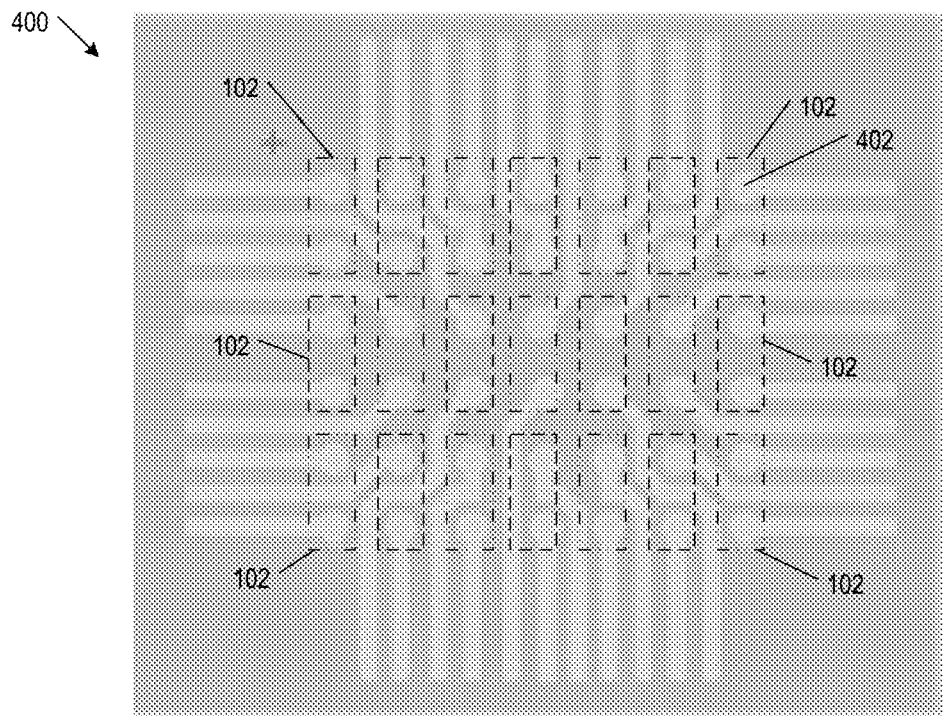
FIG. 5 illustrates in phantom the placement of junctions in the LED die of FIG. 1-2 on pads of the metalized substrate of FIG. 4 in some examples of the present disclosure.

FIG. 5 illustrates in phantom the placement of junctions 102 (only six are labeled for clarity) in LED die 100 on pads 402 (only one is labeled) of metalized substrate 400 in some examples of the present disclosure. In this configuration, each junction 102 connects to a different pair of pads 402. A dashed line indicates junctions 102 with a first type of wavelength converters 118 that emits a first color of light, and a dashed-double dotted line indicates junctions 102 with a second type of wavelength converters 118 that emits a second color of light. One or more junctions 102 that have the same type of wavelength converters 118 form a segment in LED die 100. Junctions 102 from different segments (colors) intersperse with each other in a regular pattern, such as in a checkerboard pattern (as shown), serpentine segments that spiral outward and encircle each other, or concentric circular segments. Junctions 102 from different segments may also intersperse randomly.

Figure 6:
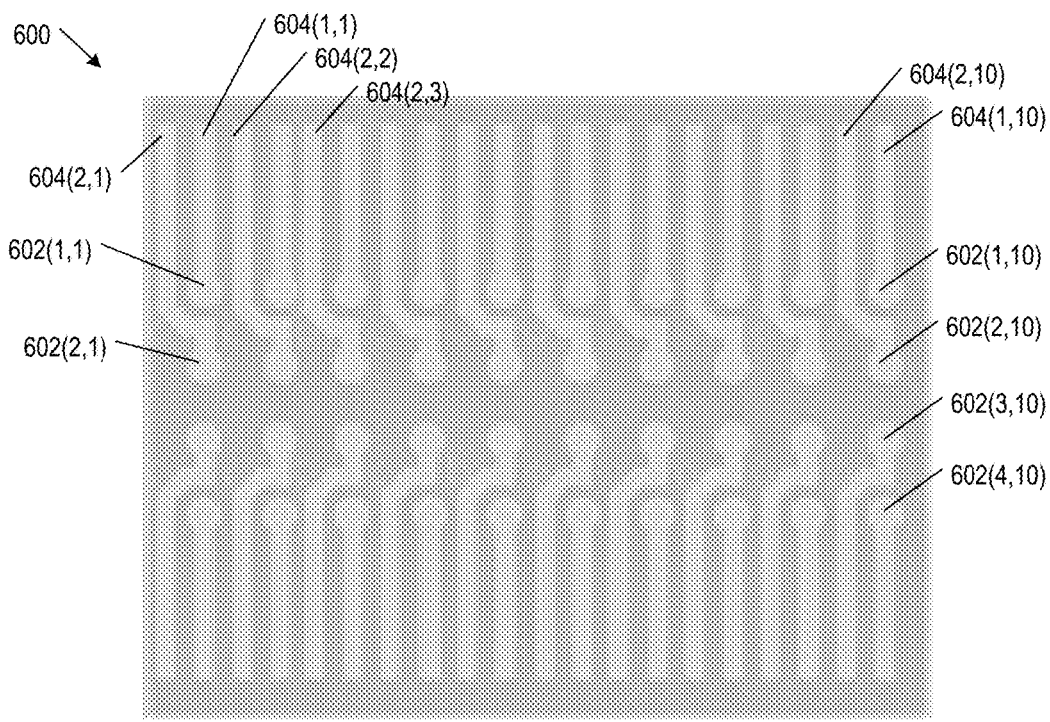
FIG. 6 is a top view of a metalized substrate in some examples of the present disclosure.

FIG. 6 is a top view of a metalized substrate 600 in some examples of the present disclosure. Metalized substrate 600 may be metalized substrate 202 in package 300 (FIG. 3). Metalized substrate 600 is a single-layer tile. Metalized substrate 600 includes a 4 by 10 array of top pads 602 (only six are labeled), and top traces 604 (only six are labeled) connected to pads 602. Top traces 604 fan out to the perimeter of the metalized substrate 600. To help understand the layout of top pads 602 and top traces 604, a specific pad is identified by its row and column numbers, and a specific trace is identified by its pad's row and column numbers. Cardinal directions are also used to describe the paths of the top traces 604.

In the first row of pads 602, traces 604(1,1) to 604(1,10) fan out to the north toward the perimeter of metalized substrate 600.

In the second row of pads 602, traces 604(2,1) to 604(2,10) fan out diagonally to the northwest and then to the north toward the perimeter of metalized substrate 600. In particular, trace 604(2,2) passes between pads 602(1,1) and 602(1,2), trace 604(2,3) passes between pads 602(1,2) and 602(1,3), . . . , and trace 604(2,10) passes between pads 602(1,9) and 602(1,10).

Traces 604 for pads 602 in the third and the fourth rows mirror the configuration of traces 604 for pads 602 in the second and the first rows.

Figure 7:
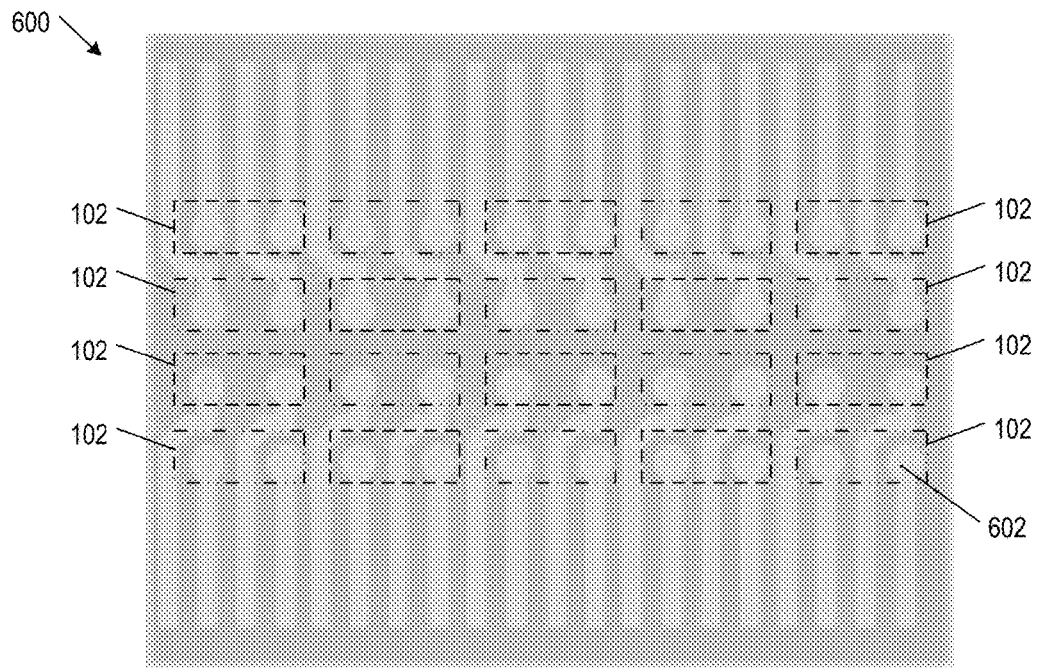
FIG. 7 illustrates in phantom the placement of junctions in the LED die of FIG. 1-2 on pads of the metalized substrate of FIG. 6 in some examples of the present disclosure.

FIG. 7 illustrates in phantom the placement of junctions 102 (only eight are labeled) in LED die 100 on pads 602 (only one is labeled) of metalized substrate 600 in some examples of the present disclosure. In this configuration, each junction 102 connects to a different pair of pads 602. A dashed line indicates junctions 102 with a first type of wavelength converters 118 that emits a first color of light, and a dashed-double dotted line indicates junctions 102 with a second type of wavelength converters 118 that emits a second color of light. One or more junctions 102 that have the same type of wavelength converters 118 form a segment in LED die 100. Junctions 102 from different segments (colors) intersperse with each other in a regular pattern, such as in a checkerboard pattern (as shown), serpentine segments that spiral outward and encircle each other, or concentric circular segments. Junctions 102 from different segments may also intersperse randomly.

Figure 8:
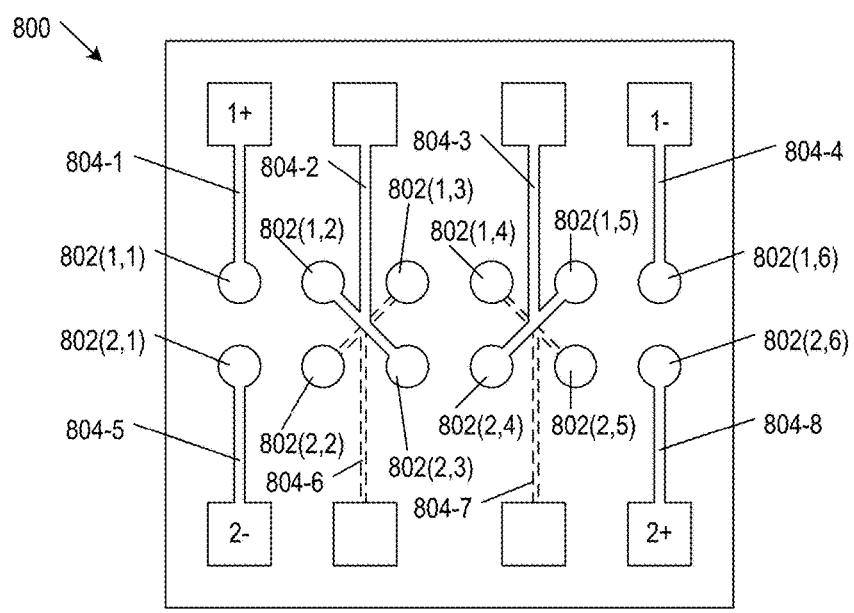
FIG. 8 is a top view of a metalized substrate in some example of the present disclosure.

FIG. 8 is a top view of a metalized substrate 800 in some example of the present disclosure. Metalized substrate 800 may be metalized substrate 202 in package 300 (FIG. 3). Metalized substrate 800 is a multi-layer tile. Metalized substrate 800 includes a 2 by 6 array of top pads 802 and traces 804-1, 804-2, . . . , and 804-8 (collectively "traces 804") connected to top pads 802. Traces 804 fan out to the perimeter of the metalized substrate. To help understand the layout of metalized substrate 800, a specific pad is identified by its row and column numbers. Cardinal directions are also used to describe the paths of the top traces 804.

In the first row of pads 802, a top trace 804-1 fans out from pad 802(1,1) and travels to the north toward the perimeter of metalized substrate 800. A top trace 804-2 has a diagonal portion that connects pads 802(1,2) and 802(2,3), and a straight portion extending from the diagonal portion to the north toward the perimeter of metalized substrate 800. A top trace 804-3 has a diagonal portion that connects pads 802(2,4) and 802(1,5), and a straight portion extending from the diagonal portion to the north toward the perimeter of metalized substrate 800. A top trace 804-4 fans out from pad 802(1,6) and travels to the north toward the perimeter of metalized substrate 800.

In the second row of pads 802, a top trace 804-5 fans out from pad 802(2,1) and travels to the south toward the perimeter of metalized substrate 800. A lower level trace 804-6 has a diagonal portion that connects pads 802(2,2) and 802(1,3), and a straight portion extending from the diagonal portion to the south toward the perimeter of metalized substrate 800. A lower level trace 804-7 has a diagonal portion that connects pads 802(1,4) and 802(2,5), and a straight portion extending from the diagonal portion to the south toward the perimeter of metalized substrate 800. A top trace 804-8 fans out from pad 802(2,6) and travels to the south toward the perimeter of metalized substrate 800.

Figure 9:
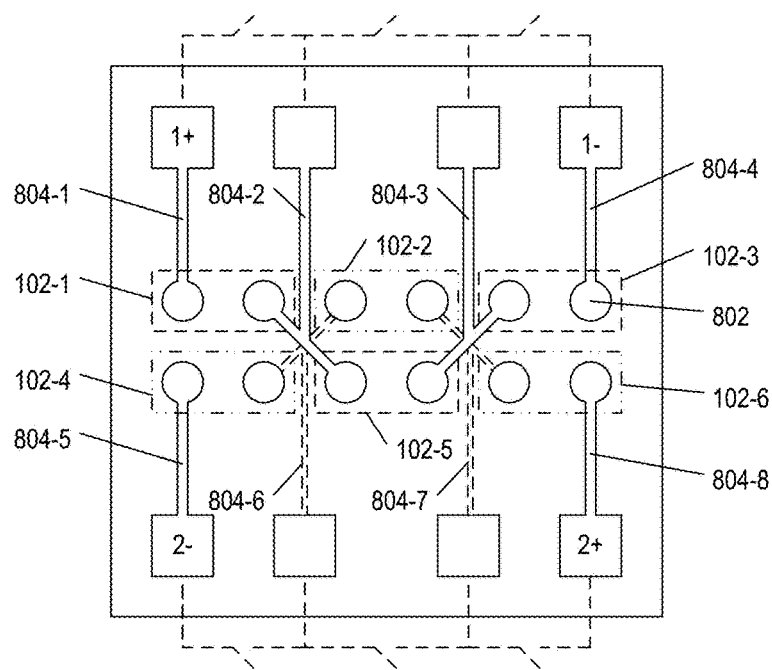
FIG. 9 illustrates in phantom the placement of junctions in the LED die of FIG. 1-2 on pads of the metalized substrate of FIG. 8 in some examples of the present disclosure.

FIG. 9 illustrates in phantom the placement of junctions 102-1, 102-2, . . . , and 102-6 in a LED die 100 on pads 802 (only one is labeled) of metalized substrate 800 in some examples of the present disclosure. In this configuration, each junction 102 connects to a different pair of pads 802. A dashed line indicates junctions 102-1, 102-3, and 102-5 have a first type of wavelength converters 118 that emits a first color of light, and a dashed-double dotted line indicates junctions 102-2, 102-4, and 102-6 have a second type of wavelength converters 118 that emits a second color of light. Junctions 102-1, 102-3, and 102-5 form a first segment in LED die 100 where the junctions connect in series. Junctions 102-2, 102-4, and 102-6 form a second segment in LED die 100 where the junctions connect in series. Junctions 102 from different segments (colors) intersperse with each other in a regular pattern, such as in a checkerboard pattern (as shown), serpentine segments that spiral outward and encircle each other, or concentric circular segments. Junctions 102 from different segments may also intersperse randomly. Any junction 102 mounted on a pair of pads 802 in a segment may be bypassed by shorting the two traces 804 connected to the two pads 802. For example, when junction 102-5 in the first segment is to be bypassed, traces 804-2 and 804-3 connected to pads 802(2,3) and 802(2,4) may be shorted by an external switch (shown in phantom).

Figure 10:
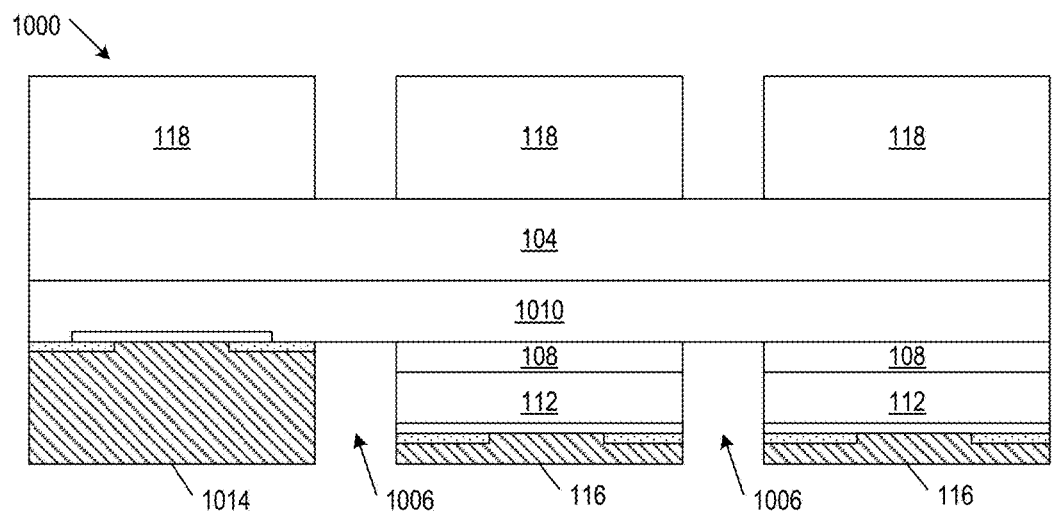
FIG. 10 is a cross-sectional view of a LED die in some examples of the present disclosure.

FIG. 10 is a cross-sectional view of LED die 1000 in some examples of the present disclosure. LED die 1000 is similar to LED die 100 (FIG. 1-2) but its junctions 102 share a common cathode 1014, which takes the place of one junction 102 in the LED die 1000. In LED die 1000, trenches 1006 surround junctions 102. Trenches 1006 reach down to an n-type semiconductor layer 1010 so junctions 102 are only partially electrically insulated from each other as they share a continuous n-type semiconductor layer 1010. In this configuration, all junctions 102 are devoid of cathodes 114 (FIG. 1-2).

Figure 11:
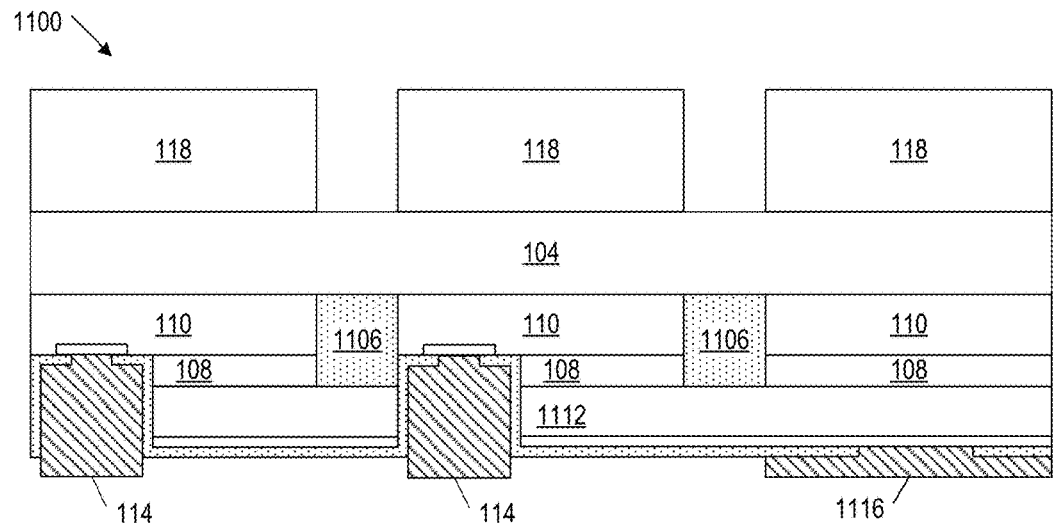
FIG. 11 is a cross-sectional view of a LED die in some examples of the present disclosure.

FIG. 11 is a cross-sectional view of LED die 1100 in some examples of the present disclosure. LED die 1100 is similar to LED die 100 (FIG. 1-2) except its junctions 102 share a common anode 1116, which takes the place of one junction 102 in the LED die 1100. In LED die 1100, trenches are formed around each junction's n-type semiconductor layer 110 and active region 108. An insulator 1106 fills these trenches before a continuous p-type semiconductor layer 1112 is formed. Junctions 102 are only partially electrically insulated from each other as they share p-type semiconductor layer 1112. In this configuration, all junctions 102 are devoid of anodes 116 (FIG. 1-2).

Figure 12:
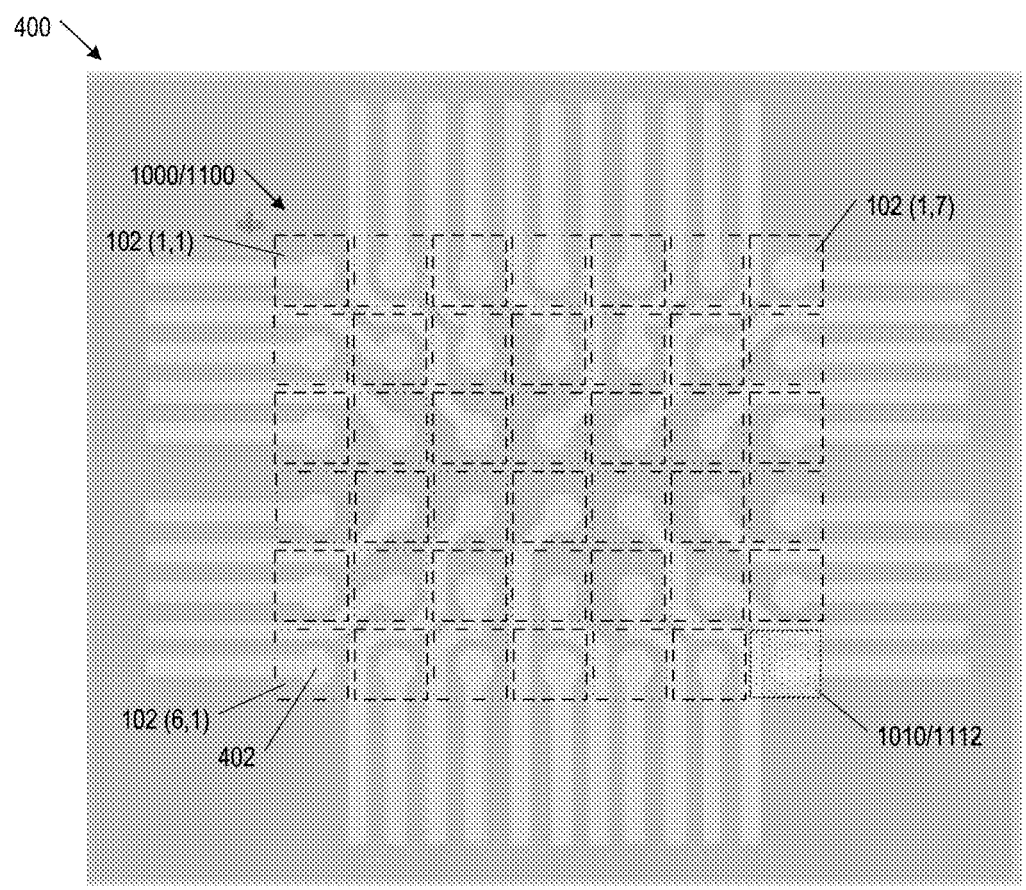
FIG. 12 illustrates in phantom the placement of junctions in the LED die of FIG. 10 or 11 on the pads of the metalized substrate of FIG. 4 in some examples of the present disclosure.

FIG. 12 illustrates in phantom the placement of junctions 102 (only one is labeled) in a LED die 1000 (FIG. 10) or 1100 (FIG. 11) on pads 402 (only one is labelled) of metalized substrate 400 in some examples of the present disclosure. In this configuration, each junction 102's anode 116 or cathode 114 (FIG. 10 or 11) connects to a different pad 402, and common cathode 1014 or common anode 1116 (FIG. 10 or 11) connects to one pad 402. A dashed line indicates junctions 102 with a first type of wavelength converters 118 that emits a first color of light, and a dashed-double dotted line indicates junctions 102 with a second type of wavelength converters 118 that emits a second color of light. One or more junctions 102 that have the same type of wavelength converters 118 form a segment in LED die 1000 or 1100. Junctions 102 from different segments (colors) intersperse with each other in a regular pattern, such as in a checkerboard pattern (as shown), serpentine segments that spiral outward and encircle each other, or concentric circular segments. Junctions 102 from different segments may also intersperse randomly.

To help understand the layout of the two serpentine segments, a specific junction 102 is identified by its row and column numbers. Junctions 102 in a first segment (color) may include junctions 102(3,4), (3,5), (4,5), (5,5), (5,4), (5,3), (5,2), (4,2), (3,2), (2,2), (1,2), (1,3), (1,4), (1,5), (1,6), (1,7), (2,7), (3,7), (4,7), and (5,7). Junctions 102 in a second segment (color) may be made up of the remaining junctions 102.

Figure 13:
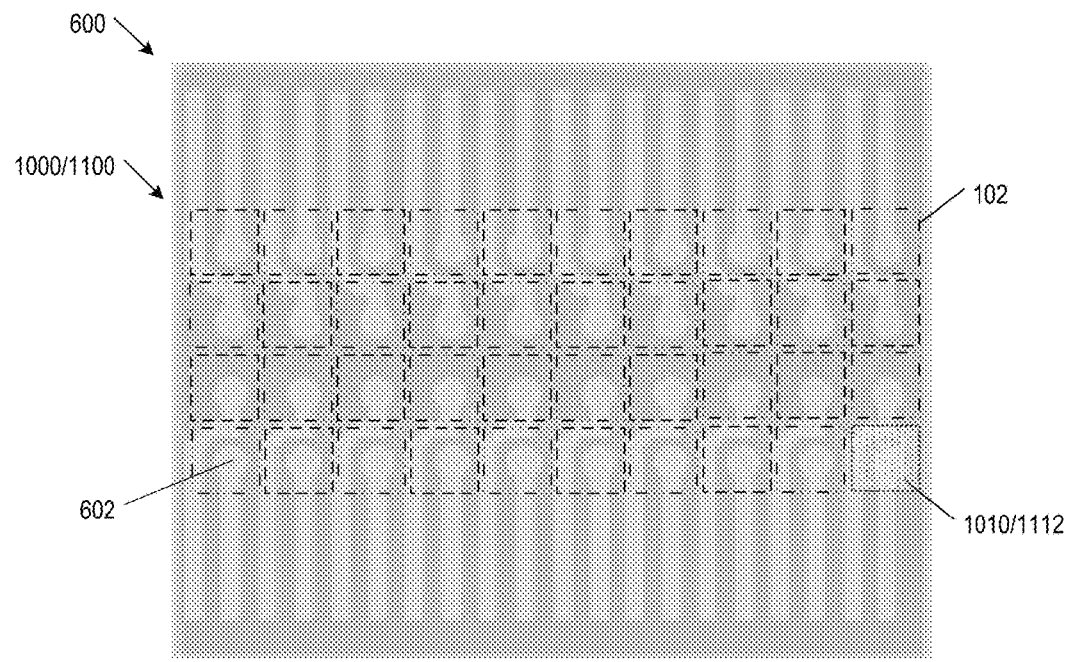
FIG. 13 illustrates in phantom the placement of junctions in the LED die of FIG. 10 or FIG. 11 on the pads of the metalized substrate of FIG. 6 in some examples of the present disclosure.

FIG. 13 illustrates in phantom the placement of junctions 102 (only one is labeled) in a LED die 1000 (FIG. 10) or 1100 (FIG. 11) on pads 602 (only one is labeled) of metalized substrate 600 in some examples of the present disclosure. In this configuration, each junction 102's anode 116 or cathode 114 (FIG. 10 or 11) connects to a different pad 602, and common cathode 1014 or common anode 1116 (FIG. 10 or 11) connects to one pad 602. A dashed line indicates junctions 102 with a first type of wavelength converters 118 that emits a first color of light, and a dashed-double dotted line indicates junctions 102 with a second type of wavelength converters 118 that emits a second color of light. One or more junctions 102 that have the same type of wavelength converters 118 form a segment in LED die 1000 or 1100. Junctions 102 from different segments (colors) intersperse with each other in a regular pattern, such as in a checkerboard pattern (as shown), serpentine segments that spiral outward and encircle each other, or concentric circular segments. Junctions 102 from different segments may also intersperse randomly.

Figure 14:
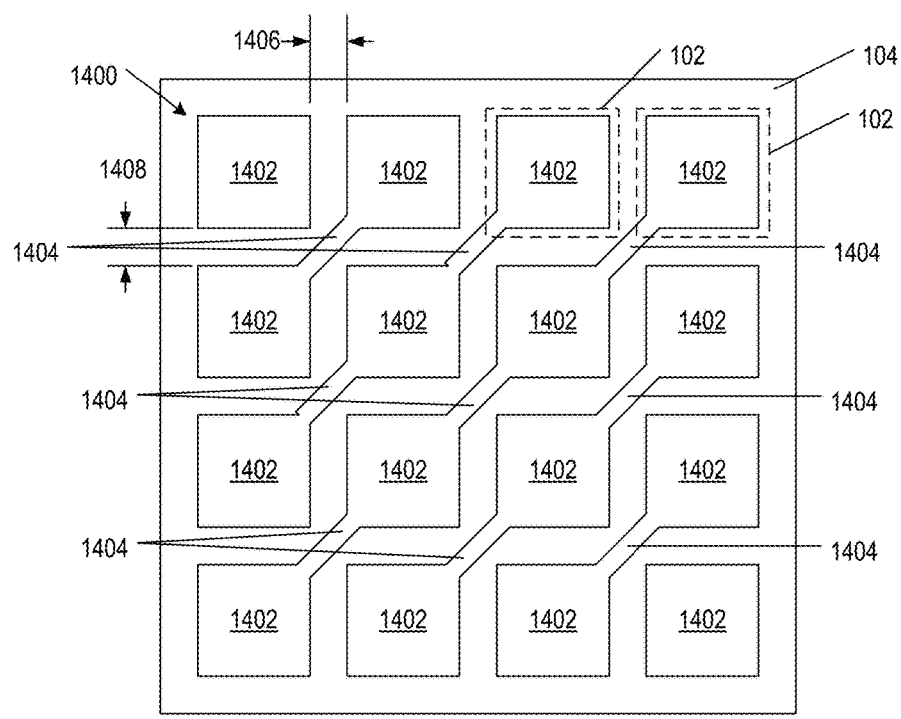
FIG. 14 illustrates a pattern of transparent conductors on a growth substrate for forming wavelength converters using electrophoretic deposition (EPD) in some examples of the present disclosure.

FIG. 14 illustrates a pattern 1400 of transparent conductors on growth substrate 104, such as a sapphire substrate, for forming wavelength converters 118 (FIG. 1-2) using electrophoretic deposition (EPD) in some examples of the present disclosure. The transparent conductors may be antimony tin oxide (ATO), indium tin oxide (ITO), or silver nanowire. The transparent conductors include blocks 1402 and diagonal lines 1404. Each block 1402 is located over a different junction 102 (only two are shown in phantom) in LED die 100, 1000, or 1100 (FIG. 1-2, 10, or 11). Although shown as squares, blocks 1402 may be other shapes such as rectangles, circles, and ovals. Each block 1402 is separated from its neighboring blocks 1402 by a gap 1406 in the horizontal direction and a gap 1408 in the vertical direction. Lines 1404 connect blocks 1402 to form strings of serially connected blocks 1402, such as diagonal strings in pattern 1400. Anti-shock or insulating layers may be deposited between junctions 102 prior to high voltage EPD.

Figures 1, 15:
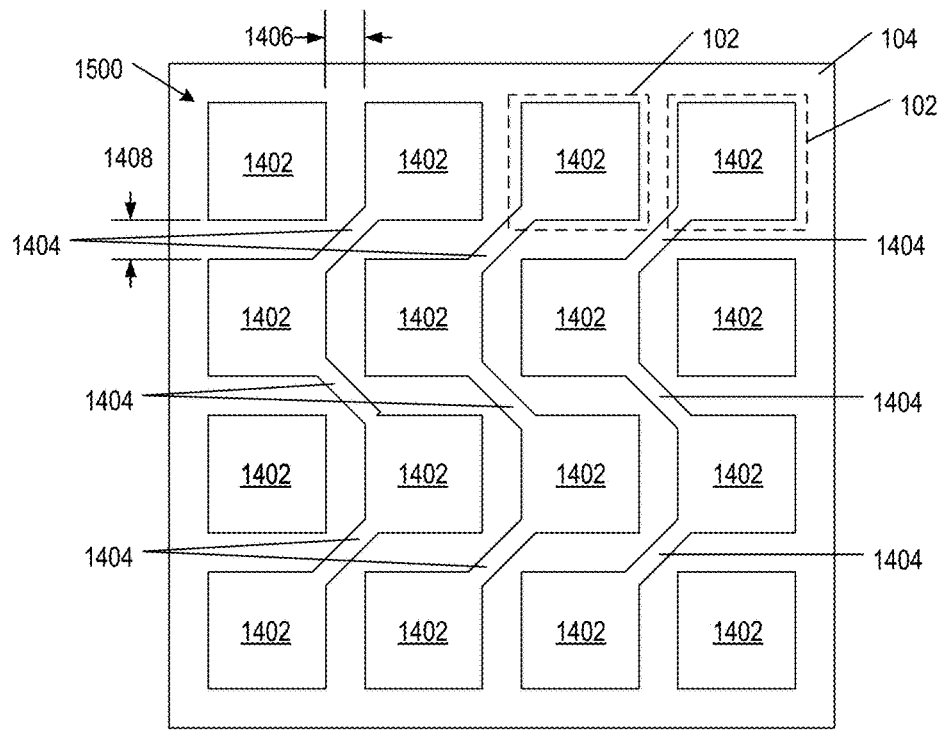
Figures 2, 15:
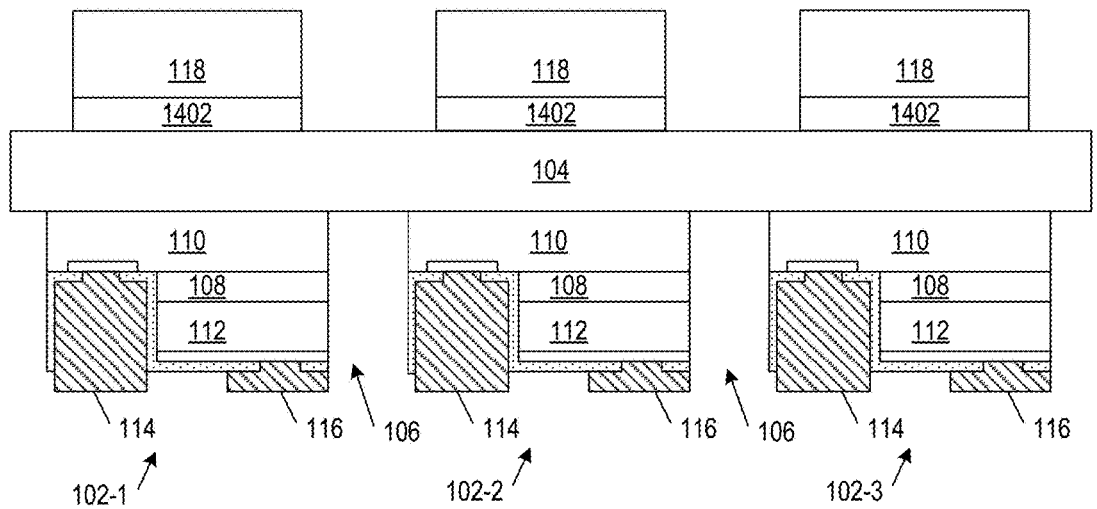
Figures 3, 15:
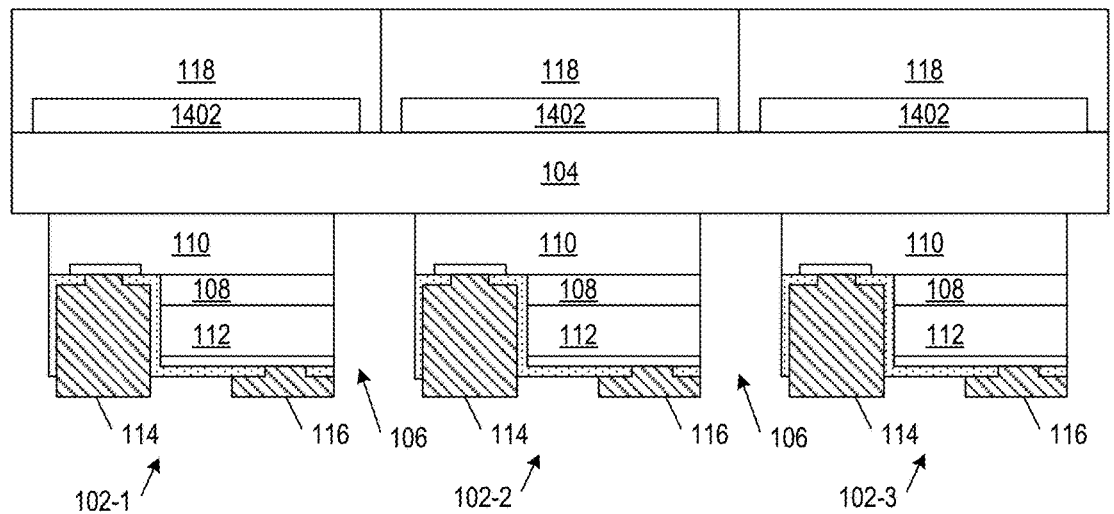

FIG. 15-1 illustrates another pattern 1500 of transparent conductors on growth substrate 104 for forming wavelength converters 118 (FIG. 1-2) using EPD in some examples of the present disclosure. Lines 1404 connect blocks 1402 to form diagonally alternating strings (every-other-junction) in pattern 1500.

For illustrative purposes, assume an LED die 100 includes junctions 102 that emit blue light and wavelength converters 118 are cool-white and warm-white phosphor layers that convert blue light to cool-white and warm-white colors, respectively. In a first EPD process, a first voltage is applied to a first group of strings in pattern 1400 or 1500 and cool-white phosphors are electrophoretically deposited on the first group of strings. During the first EPD process, a second voltage is applied to a second group of strings in pattern 1400 or 1500 so cool-white phosphors are not formed on the second group of strings. To reduce the risk of electrical sparking between neighboring strings, a non-zero second voltage is applied to the second group of strings. For example, the first voltage may be 800 volts while the second voltage may be 400 volts. To create a sharp transition in amount, type, or thickness of phosphor between neighboring strings, a second voltage of the opposite polarity is applied to the second group of strings. For example, the first voltage may be 800 volts while the second voltage may be −400 volts. Alternatively, the second group of strings in pattern 1400 or 1500 is not biased but kept floating.

In a second EPD process, a third voltage is applied to the second group of strings and warm-white phosphors are electrophoretically deposited on the second group of strings. During this second EPD process, a fourth voltage is applied to the first group of strings so warm-white phosphors are not formed on the first group of strings. To reduce the risk of electrical sparking between neighboring strings, a non-zero fourth voltage is applied to the first group of strings. To create a sharp transition in amount, type, or thickness of phosphor between neighboring strings, a fourth voltage of the opposite polarity is applied to the first group of strings. The same or different voltages described for the first EPD process may also be used for the second EPD process. Alternatively, the first group of strings in pattern 1400 or 1500 is not biased but kept floating. Note the EPD processes may be applied on a wafer scale to multiple LED dies 100 in a device wafer or individually to discrete LED die 100 singulated from the device wafer.

Each phosphor layer (wavelength converter) 118 has sufficient thickness to fully or substantially convert light entering the phosphor layer 118. The phosphor thickness is controlled by the applied voltage, applied current, or the applied duration in the EPD process.

The size of phosphor layers 118 may be adjusted by increasing or decreasing the size of the underlying transparent conductor blocks 1402. The size of the transparent conductor blocks 1402 may be increased to make the footprint of phosphor layers 118 larger than the underlying junctions 102, and the size of the transparent conductor blocks 1402 may be decreased to make the footprint of phosphor layers 118 smaller than the underlying junctions 102 as shown in FIG. 15-2 in some examples of the present disclosure. Separation of phosphor layers 118 can be adjusted by increasing or decreasing gaps 1404 and 1406 between the underlying transparent conductor blocks 1402. By decreasing gaps 1404 and 1406, phosphors layers 118 of different colors may abut against each other as shown in FIG. 15-3 in some examples of the present disclosure. By increasing gaps 1404 and 1406, phosphors layers 118 of different colors may be separated by gaps between them.

Figure 16:
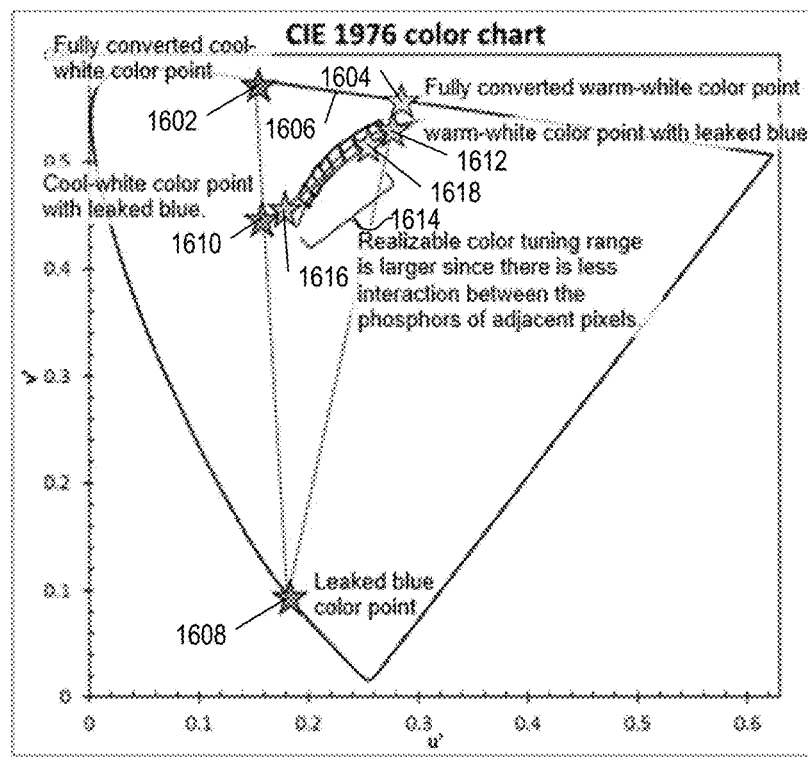
FIG. 16 is an International Commission on Illumination (CIE) 1976 color chart illustrating a hypothetical color tuning range of the LED die of FIG. 1-2 having cool-white and warm-white phosphor layers in some examples of the present disclosure.

FIG. 16 is an International Commission on Illumination (CIE) 1976 color chart illustrating a hypothetical color tuning range of a LED die 100 having cool-white and warm-white phosphor layers in some examples of the present disclosure. The actual color tuning range of LED die 100 may be determined by simulation or experimentation. LED die 100 theoretically produces only a cool-white color at point 1602 when the cool-white segment is turned on and the warm-white segment is turned off. LED die 100 theoretically produces only a warm-white color at point 1604 when the warm-white segment is turned on and the cool-white segment is turned off. LED die 100 produces a color along a line 1606 drawn between color endpoints 1602 and 1604 when a combination of junctions 102 in the cool-white segment and the warm-white segment are turned on. The color of the blue light emitted by the underlying junctions 102 is indicated as point 1608.

It may be desired to change color endpoints 1602 and 1604 to more desirable colors by allowing blue light to leak from junctions 102 in the cool-white and the warm-white segments. To allow blue light to leak from junctions 102 in the cool-white segment, each cool-white phosphor layer 118 is made with a smaller footprint than its underlying junction 102. The ratio of the converted area to the unconverted area, and any blue light that escapes through the cool-white phosphor layer 118 itself, determines the blue light leakage for the cool-white phosphor layer 118 and sets a new cool-white color with leaked blue light at point 1610. Similarly, each warm-white phosphor layer 118 is made with a footprint smaller than its underlying junction 102. The ratio of the converted area to the unconverted area, and any blue light that escapes through the warm-white phosphor layer 118 itself, determines the blue light leakage for the warm-white phosphor layer 118 and sets a new warm-white color with leaked blue light at point 1612.

The actual color tuning range of LED die 100 is not between new endpoints 1610 and 1612. This is because the actual color tuning range is reduced by crosstalk between neighboring junctions 102 caused by blue light emitted near the edge of one junction 102 entering another junction's phosphor layer 118 and converting to a different color. Thus, the actual color turning range 1614 is between a cool-white color with leaked blue light and crosstalk at point 1616 and a warm-white color with leaked blue light and crosstalk at point 1618. Fortunately, each phosphor layer 118 only partially covers its underlying junction 102 so the phosphor layer 118 is separated from its neighboring phosphor layers 118. This separation reduces the crosstalk between phosphor layers 118 of neighboring junctions 102 and thereby increases the actual color tuning range 1614 of LED die 100.

Figure 17:
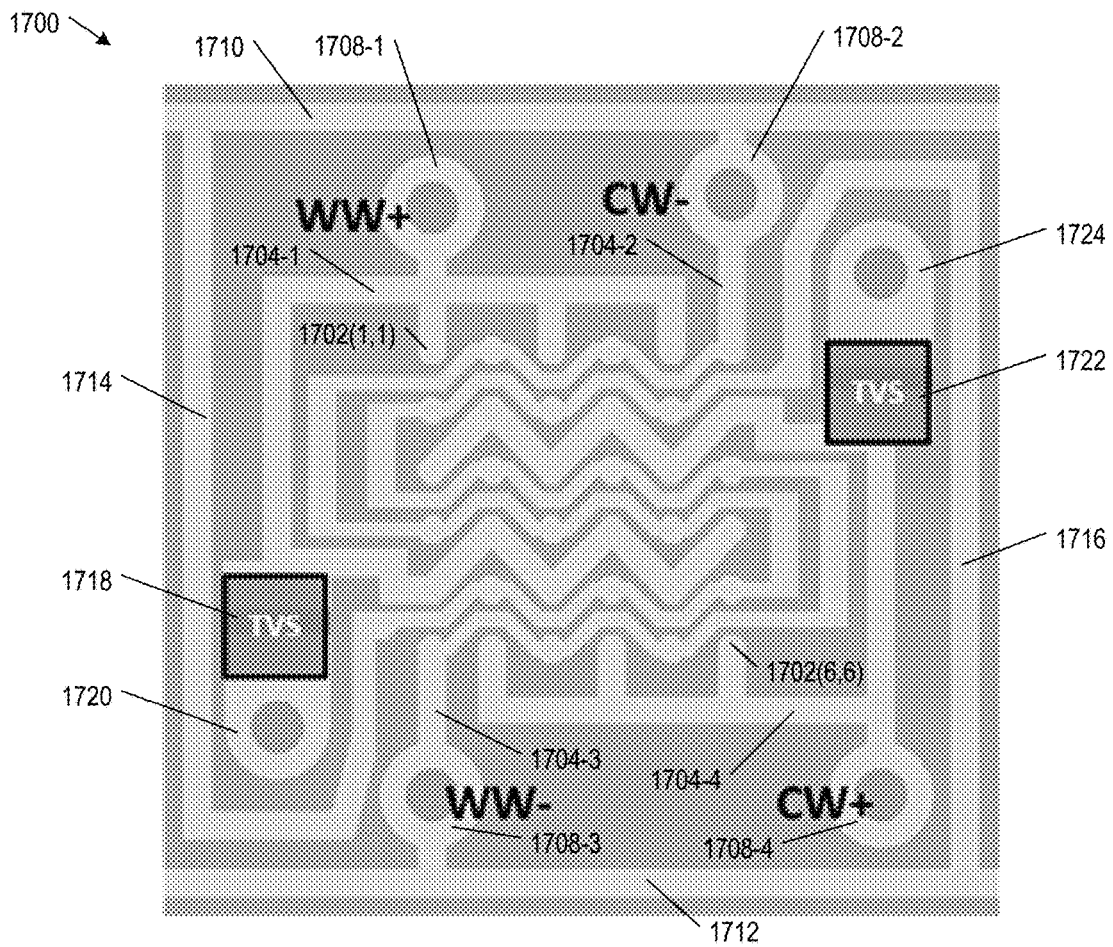
FIGS. 17 and 18 are top and bottom views, respectively, of a metalized substrate in some example of the present disclosure.
Figure 18:
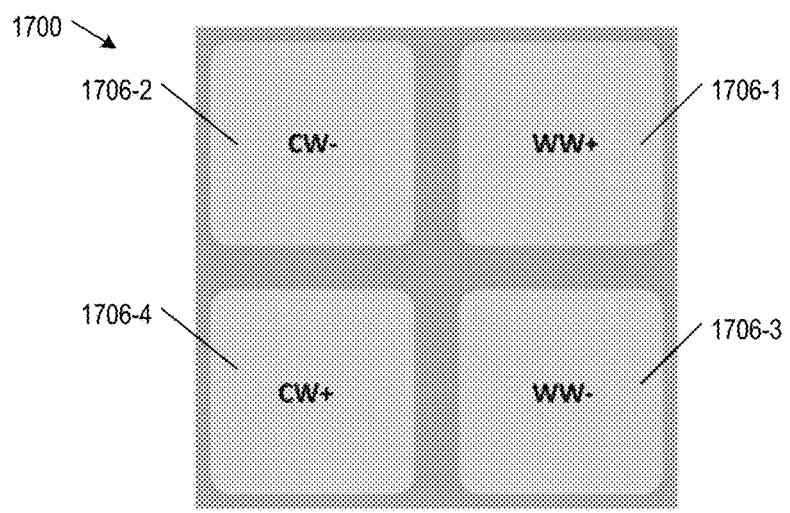
Figures 1, 19:
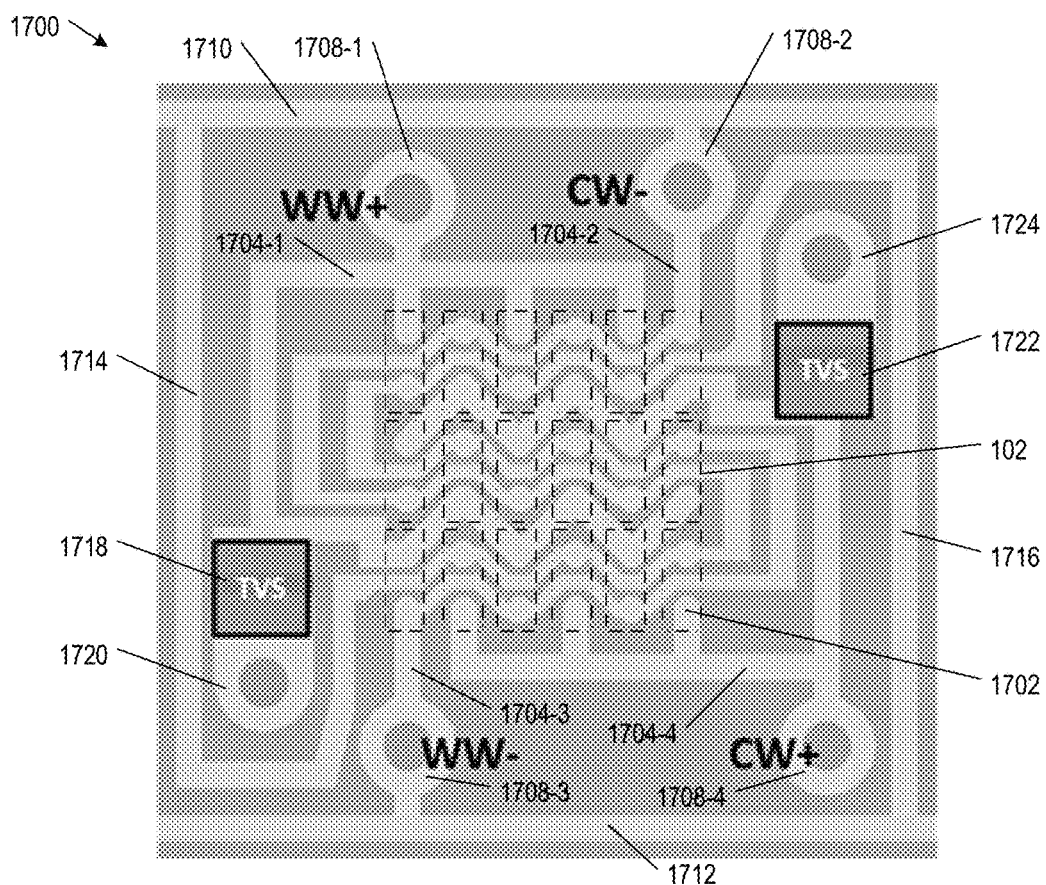
Figures 2, 19:
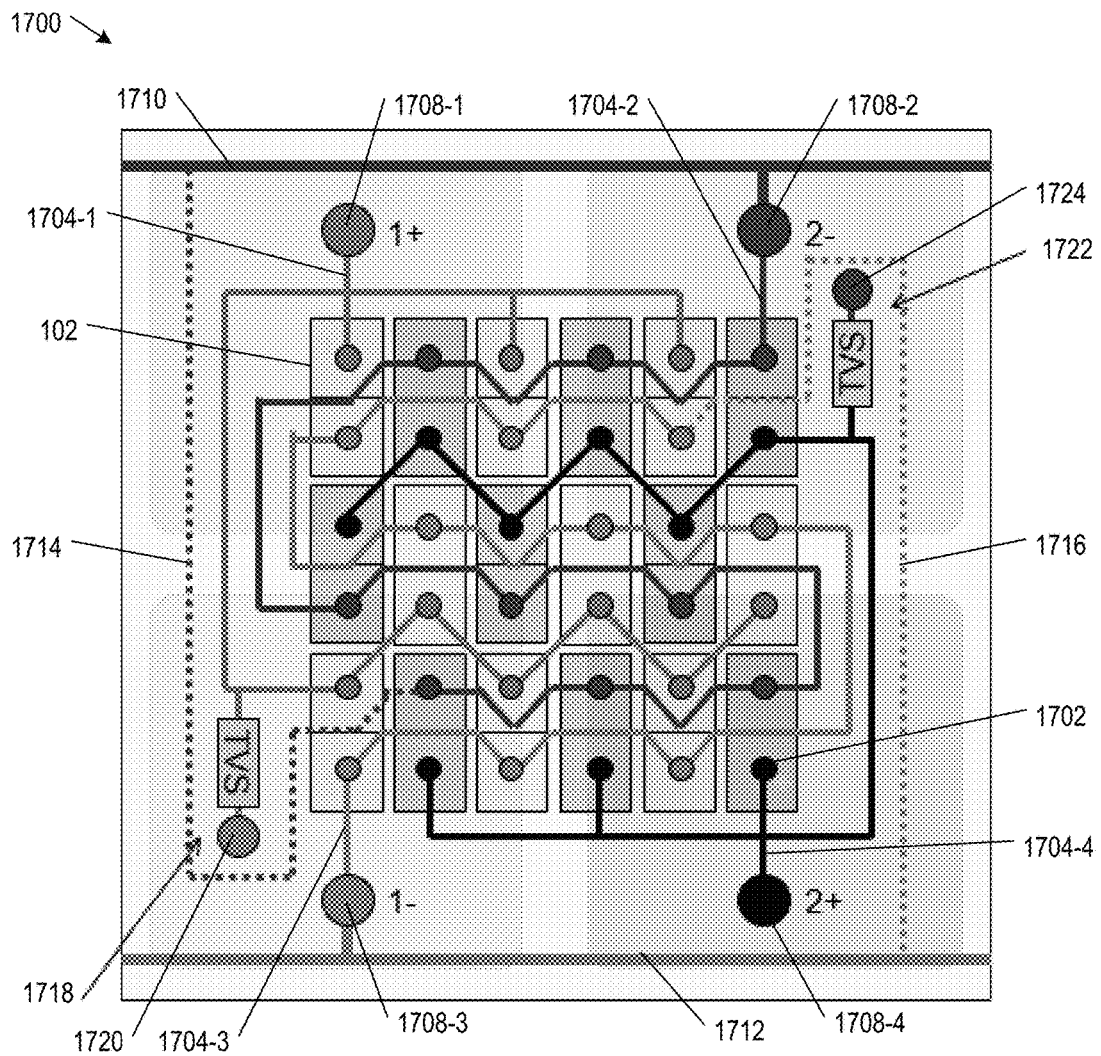

FIGS. 17 and 18 are top and bottom views, respectively, of a metalized substrate 1700 in some example of the present disclosure, and FIG. 19 illustrates in phantom the placement of junctions 102 (only one is labeled) of a LED die 100 (FIG. 1-2) on metalized substrate 1700 in some examples of the present disclosure. Instead of mounting a LED die 100 on metalized substrate 1700, individual junctions 102 singulated from a device wafer may be picked and placed on metalized substrate 1700. Metalized substrate 1700 may be metalized substrate 202 in package 300 (FIG. 3). Metalized substrate 1700 is a multi-layer tile. Metalized substrate 1700 is configured to connect junctions 102 of a LED die 100 in two segments, such as a cool-white segment and a warm-white segment. Each segment has its junctions 102 connected in parallel, and junctions 102 from the cool-white segment and the warm-white segment are interspersed with each other in regular pattern, such a checkerboard pattern (as shown in FIGS. 19-1 and 19-2), serpentine segments that spiral outward and encircle each other, or concentric circular segments. Junctions 102 from the cool-white segment and the warm-white segment may also interspersed randomly. In other examples, a segment may be a saturated color or pure blue. For example, the two segments may be a red segment and a green segment.

Referring to FIG. 17, the top surface of metalized substrate 1700 includes a 6 by 6 array of top pads 1702 (only two are labeled), and top traces 1704-1, 1704-2, 1704-3, and 1704-4 (collectively as "traces 1704") connected to top pads 1702. To help understand the layout of top pads 1702, a specific pad is identified by its row and column numbers. Metalized substrate includes vias 1708-1, 1708-2, 1708-3, and 1708-4. Referring to FIG. 18, the bottom surface of metalized substrate 1700 includes bottom pads 1706-1, 1706-2, 1706-3, and 1706-4 connected to vias 1708-1, 1708-2, 1708-3, and 1708-4, respectively.

Referring to FIGS. 19-1 and 19-2, trace 1704-1 connects to bottom pad 1706-1 (FIG. 17) through via 1708-1. Trace 1704-1 further connects to pads 1702(1,1), (1,3), (1,5), (5,1), (4,2), (5,3), (4,4), (5,5), (4,6). With junctions 102 of a LED die 100 mounted on metalized substrate 1700, trace 1704-1 connects anodes 116 of junctions 102 in a first segment in parallel to bottom (anode) pad 1706-1. Junctions 102 in the first (e.g., warm-white) segment are indicated by a dashed line and have a first type of wavelength converters 118 that emits a first color of light (e.g., warm-white).

Trace 1704-3 connects to bottom pad 1706-3 (FIG. 17) through via 1708-3. Trace 1704-3 further connects to pads 1702(6,1), (6,3), (6,5), (3,6), (3,4), (3,2), (2,1), (2,3), (2,5). With junctions 102 of a LED die 100 mounted on metalized substrate 1700, trace 1704-3 connects cathodes 114 of junctions 102 in the first segment in parallel to bottom (cathode) pad 1706-3.

Trace 1704-2 connects to bottom pad 1706-2 (FIG. 17) through via 1708-2. Trace 1704-2 further connects to pads 1702(1,6), (1,4), (1,2), (4,1), (4,3), (4,6), (5,6), (5,4), (5,2). With junctions 102 of a LED die 100 mounted on metalized substrate 1700, trace 1704-2 connects cathodes 114 of junctions 102 in a second segment in parallel to bottom (cathode) pad 1706-2. Junctions 102 in the second (e.g., cool-white) segment are indicated by a dashed-double dotted line and have a second type of wavelength converters 118 that emits a second color of light (e.g., cool-white).

Trace 1704-4 connects to bottom pad 1706-4 (FIG. 17) through via 1708-4. Trace 1704-4 further connects to pads 1702(6,2), (6,4), (6,6), (2,6), (3,5), (2,4), (3,3), (2,2), (3,1). With junctions 102 of a LED die 100 mounted on metalized substrate 1700, trace 1704-4 connects anodes 116 of junctions 102 in the second segment in parallel to bottom (anode) pad 1706-4.

The top surface of metalized substrate 1700 includes bias lines 1710 and 1712 connected to vias 1708-2 and 1708-3, respectively. Bias lines 1710 and 1712 are used to bias (apply voltage to) the two segments during EPD to form wavelength converters 118.

The top surface of metalized substrate 1700 may include secondary paths to bias lines 1710 and 1712 to physically reduce the total length of each string and therefore reduce total parasitic resistance. For example, a trace 1714 (shown in phantom) connects the far end of trace 1704-2 to bias line 1710, and a trace 1716 (shown in phantom) connects the far end of trace 1704-3 to bias line 1712.

Metalized substrate 1700 may include a transient-voltage-suppression (TVS) diode to each segment. For example, metalized substrate 1700 includes a TVS diode 1718 connected to bottom (anode) pad 1706-1 through trace 1704-1, and a via 1720 that connects TVS diode 1718 to bottom (cathode) pad 1706-3. Metalized substrate 1700 includes a TVS diode 1722 connected to bottom (anode) pad 1706-4 through trace 1704-4, and a via 1724 that connects TVS diode 1722 to bottom (cathode) pad 1706-2.

Figure 20:
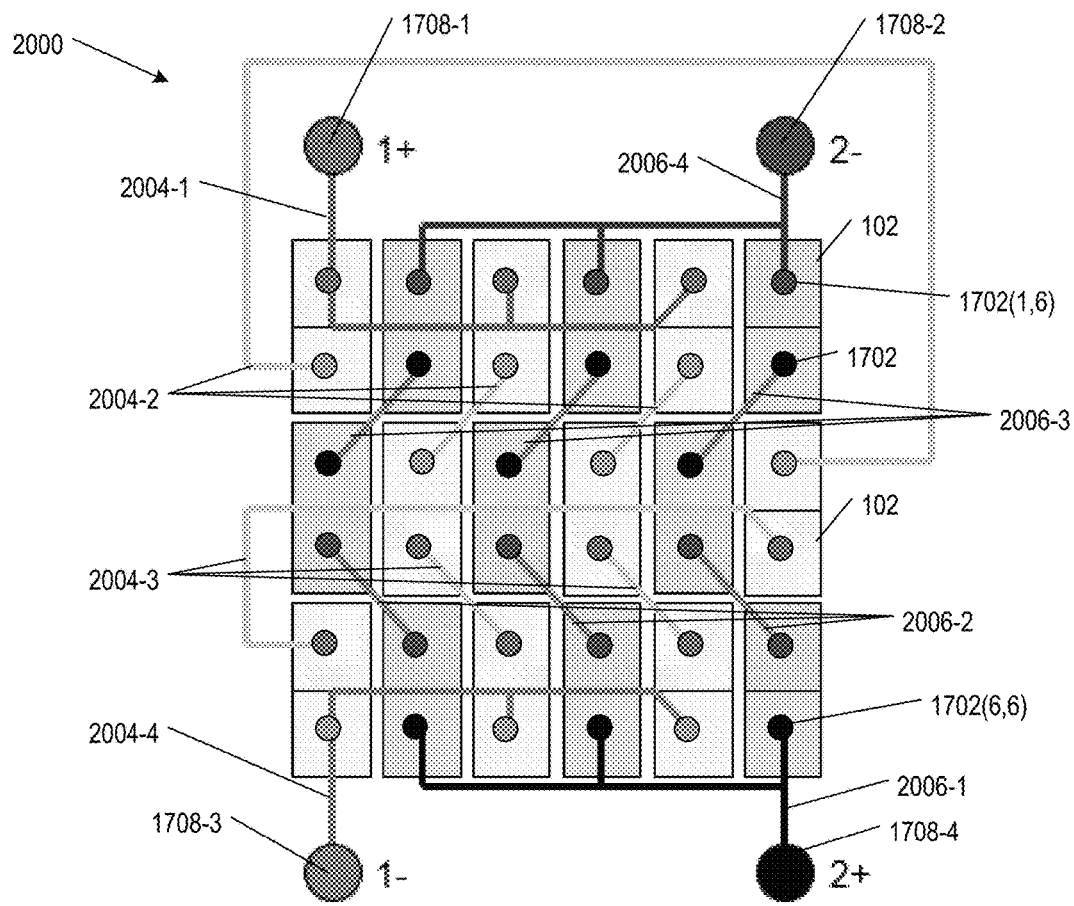
FIG. 20 illustrates electrically connected strings of a metalized substrate that is a variation of the metalized substrate of FIG. 17 in some examples of the present disclosure.

FIG. 20 illustrates electrically connected strings of a metalized substrate 2000 that is a variation of metalized substrate 1700 in some example of the present disclosure. Metalized substrate 2000 is similar to metalized substrate 1700 except top traces are changed so that each segment has three sets of junctions 102 connected in parallel.

In the first (e.g., warm-white) segment, a trace 2004-1 connects via 1708-1 to pads 1702(1,1), (1,3), (1,5). Traces 2004-2 connect pad 1702(2,1) to pad 1702(3,6), pad 1702(2,3) to pad 1702(3,2), and pad 1702(2,5) to pad (3,4). Traces 2004-3 connect pad 1702(4,2) to pad 1702(5,3), pad 1702(4,4) to pad 1702(5,5), and pad 1702(4,6) to pad 1702(5,1). A trace 2004-4 connects pads 1702(6,1), (6,3), and (6,5) to via 1708-3.

With junctions 102 in a LED die 100 mounted on metalized substrate 2000, traces 2004 connect three (3) sets of junctions 102 in parallel between vias 1708-1 and 1708-3. The first set includes junctions 102 mounted on a pair of pads 1702(1,1) and (2,1), a pair of pads 1702(3,6) and (4,6), and a pair of pads 1702(5,1) and (6,1). The second set includes junctions 102 mounted on a pair of pads 1702(1,3) and (2,3), a pair of pads 1702(3,2) and (4,2), and a pair of pads 1702(5,3) and (6,3). The third set includes junctions 102 mounted on a pair of pads 1702(1,5) and (2,5), a pair of pads 1702(3,4) and (4,4), and a pair of pads 1702(5,5) and (6,5).

In the second (e.g., cool-white) segment, a trace 2006-1 connects via 1708-4 to pads 1702(6,2), (6,4), (6,6). Traces 2006-2 connect pad 1702(5,2) to pad 1702(4,1), pad 1702(5,4) to pad 1702(4,3), and pad 1702(5,6) to pad (4,5). Traces 2006-3 connect pad 1702(3,1) to pad 1702(2,2), pad 1702(3,3) to pad 1702(2,4), and pad 1702(3,5) to pad 1702(2,6). A trace 2006-4 connects pads 1702(1,2), (1,4), and (1,6) to via 1708-2.

With junctions 102 in a LED die 100 mounted on metalized substrate 2000, traces 2006 connect three (3) sets of junctions 102 in parallel between vias 1708-4 and 1708-2. The first set includes junctions 102 mounted on a pair of pads 1702(6,2) and (5,2), a pair of pads 1702(4,1) and (3,1), and a pair of pads 1702(2,2) and (1,2). The second set includes junctions 102 mounted on a pair of pads 1702(6,4) and (5,4), a pair of pads 1702(4,3) and (3,3), and a pair of pads 1702(2,4) and (1,4). The third set includes junctions 102 mounted on a pair of pads 1702(6,6) and (5,6), a pair of pads 1702(4,5) and (3,5), and a pair of pads 1702(2,6) and (1,6).

For illustrative purposes, assume growth substrate 104 has been removed from junctions 102 of a LED die 100 mounted on metalized substrate 1700 or 2000, and cool-white phosphor layers and warm-white phosphor layers are to be formed on junctions 102 using EPD. In a first EPD process, a first voltage is applied to the warm-white segment through via 1708-1 and warm-white phosphors are electrophoretically deposited on junctions 102 of the warm-white segment. During the first EPD process, a second voltage is applied to the cool-white segment through via 1708-4 so warm-white phosphors are not formed on junctions 102 of the cool-white segment. To reduce the risk of electrical sparking between neighboring strings, a non-zero second voltage is applied to the cool-white segment. For example, the first voltage may be 800 volts while the second voltage may be 400 volts. To create a sharp transition in amount, type, or thickness of phosphor between the two segments, a second voltage of the opposite polarity is applied to the cool-white segment. For example, the first voltage may be 800 volts while the second voltage may be −400 volts. Alternatively, the cool-white segment is not biased but kept floating.

In a second EPD process, a third voltage is applied to the cool-white segment through via 1708-4 and cool-white phosphors are electrophoretically deposited on junctions 102 of the cool-white segment. During this second EPD process, a fourth voltage is applied to the warm-white segment through via 1708-1 so cool-white phosphors are not formed on junctions 102 of the warm-white segment. To reduce the risk of electrical sparking between neighboring strings, a non-zero fourth voltage is applied to the warm-white segment. To create a sharp transition in amount, type, or thickness of phosphor between the two segments, a fourth voltage of the opposite polarity is applied to the warm-white segment. The same voltages described for the first EPD process may also be used for the second EPD process. Alternatively, the warm-white segment is not biased but kept floating.

Figure 21:
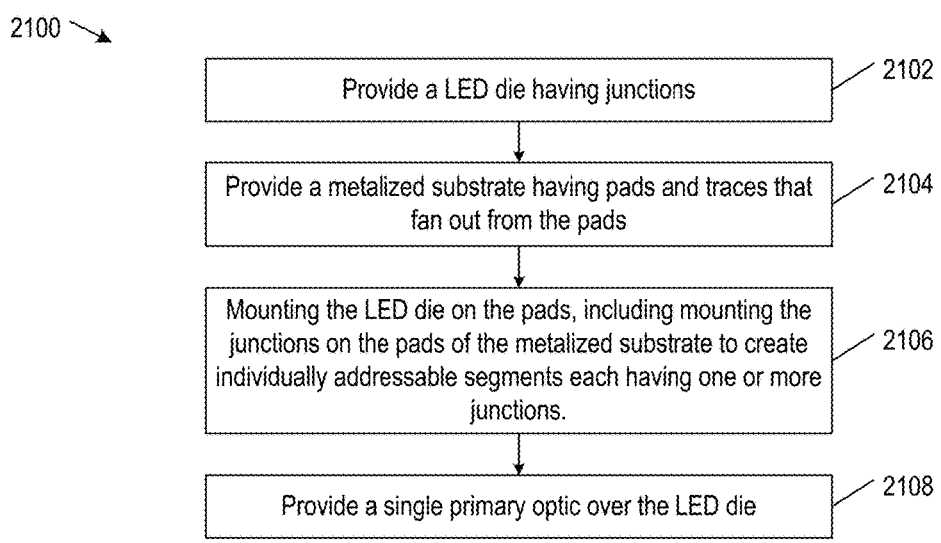
FIG. 21 is a flowchart of a method for making a light-emitting device package in examples of the present disclosure.

FIG. 21 is a flowchart of a method 2100 for making light-emitting device package 300 in examples of the present disclosure. Method 2100 may begin in block 2102.

In block 2102, a LED die is provided. The LED die includes junctions. The LED die may be LED die 100, 1000, or 1100 (FIG. 1-2, 10, or 11). The LED die may include wavelength converters on its growth substrate over its junctions. Block 2102 is followed by block 2104.

In block 2104, a metalized substrate is provided. The metalized substrate has pads and traces connected to the pads. The metalized substrate may be metalized substrate 400, 600, 800, 1700, or 2000 (FIG. 4, 6, 8, 17, or 20). Block 2104 may be followed by block 2106.

In block 2106, the LED die is mounted on the metalized substrate. For example, the junctions are mounted on the pads of the metalized substrate to create individually addressable segments. Each segment has one or more junctions. If wavelength converters are not present in the LED die, they are formed on the growth substrate of the LED die after the LED die is mounted on the metalized substrate. Alternatively, the growth substrate of the LED die is removed and the wavelength converters are formed on the junctions in the LED die. Block 2106 may be followed by block 2108.

In block 2108, a primary optic is mounted over the LED die.

Figure 22:
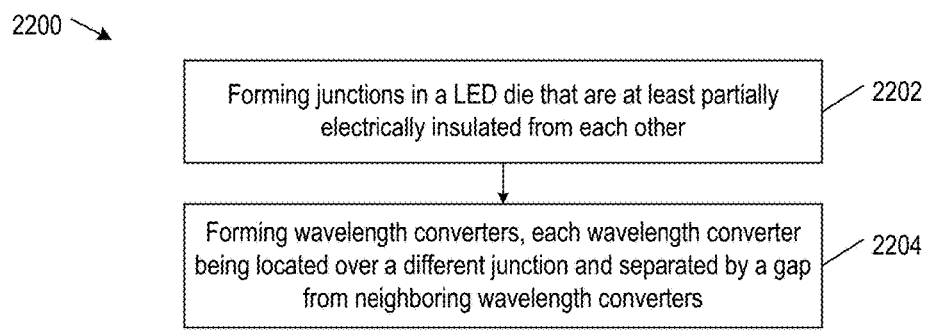
FIG. 22 is a flowchart of a method for making a LED die in examples of the present disclosure.

FIG. 22 is a flowchart of a method 2200 for making a LED die in examples of the present disclosure. Method 2200 may begin in block 2202.

In block 2202, junctions are formed that are at least partially electrically insulated from each other. Block 2202 may be followed by block 2204.

In block 2204, wavelength converters are formed. Each wavelength converter is located over a different junction and separated by a gap from neighboring wavelength converters.

Figure 23:
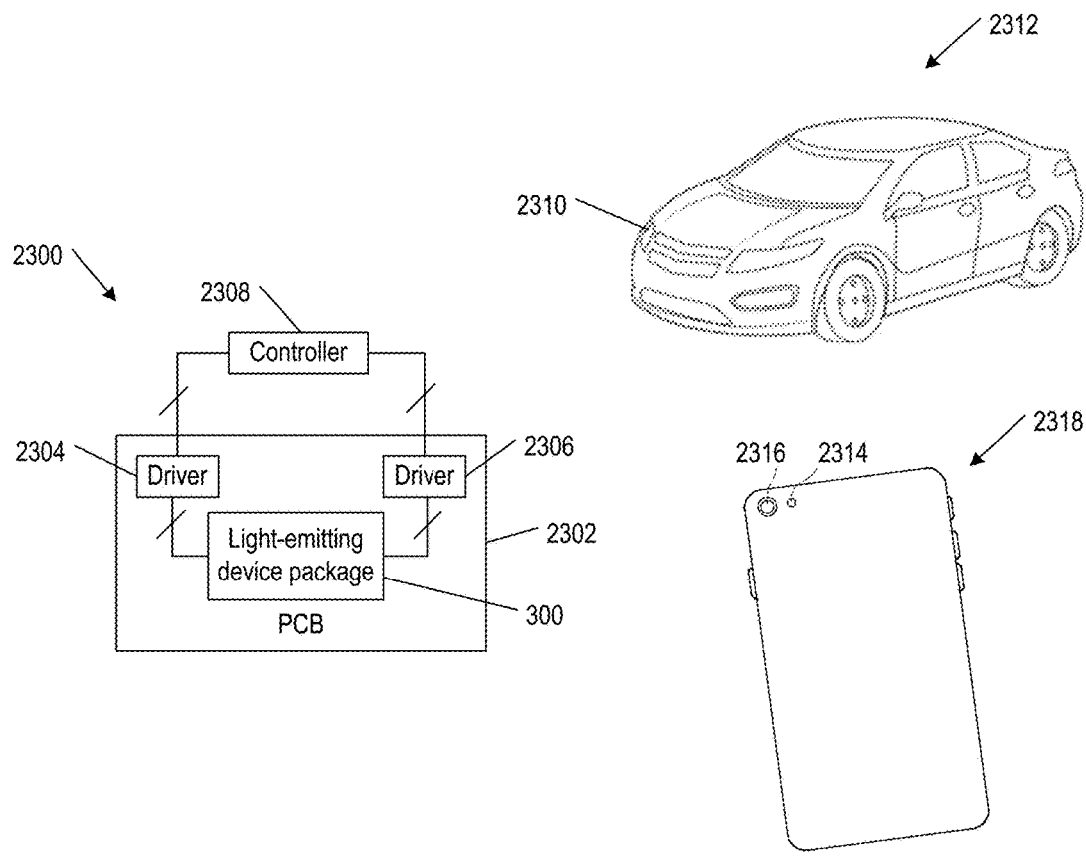
FIG. 23 illustrates applications of the light-emitting device package of FIG. 3 in examples of the present disclosure.

The devices described above may be used in any suitable application, such as general lighting, backlighting, or specialized lighting applications. FIG. 23 shows a system 2300 in some examples of the present disclosure. System 2300 includes a package 300 mounted on a printed circuit board (PCB) 2302. Package 300 has traces to its junctions connected by PCB traces to one or more drivers 2304 and 2306 on the PCB 2302, which are controlled by a microcontroller 2308. System 2300 may be part of a headlight assembly 2310 of a motor vehicle 2312 where the headlight assembly 2310 is capable of beam steering, spot reduction, highlighting and dynamic effect features. For a color changing package 300, system 2300 may be part of a flash 2314 for a camera 2316 in a mobile phone 2318 where the flash 2314 is capable of color adjustment.

The devices described above may be light emitting pixel arrays that support applications benefiting from fine-grained intensity, spatial, and temporal control of light distribution. This may include, but is not limited to, precise spatial patterning of emitted light from pixel blocks or individual pixels. Depending on the application, emitted light may be spectrally distinct, adaptive over time, and/or environmentally responsive. The light emitting pixel arrays may provide pre-programmed light distribution in various intensity, spatial, or temporal patterns. The emitted light may be based at least in part on received sensor data and may be used for optical wireless communications. Associated optics may be distinct at a pixel, pixel block, or device level. An example light emitting pixel array may include a device having a commonly controlled central block of high intensity pixels with an associated common optic, whereas edge pixels may have individual optics. Common applications supported by light emitting pixel arrays include camera flashes, automotive headlights, architectural and area illumination, street lighting, and informational displays.

A light emitting pixel array may be well suited for camera flash applications for mobile devices. Typically, an intense brief flash of light from a high intensity LED is used to support image capture. Unfortunately, with conventional LED flashes, much of the light is wasted on illumination of areas that are already well lit or do not otherwise need to be illuminated. Use of a light emitting pixel array may provide controlled illumination of portions of a scene for a determined amount of time. This may allow the camera flash to, for example, illuminate only those areas imaged during rolling shutter capture, provide even lighting that minimizes signal to noise ratios across a captured image and minimizes shadows on or across a person or target subject, and/or provide high contrast lighting that accentuates shadows. If pixels of the light emitting pixel array are spectrally distinct, color temperature of the flash lighting may be dynamically adjusted to provide wanted color tones or warmth.

Automotive headlights that actively illuminate only selected sections of a roadway are also supported by light emitting pixel arrays. Using infrared cameras as sensors, light emitting pixel arrays activate only those pixels needed to illuminate the roadway while deactivating pixels that may dazzle pedestrians or drivers of oncoming vehicles. In addition, off-road pedestrians, animals, or signs may be selectively illuminated to improve driver environmental awareness. If pixels of the light emitting pixel array are spectrally distinct, the color temperature of the light may be adjusted according to respective daylight, twilight, or night conditions. Some pixels may be used for optical wireless vehicle to vehicle communication.

Architectural and area illumination may also benefit from light emitting pixel arrays. Light emitting pixel arrays may be used to selectively and adaptively illuminate buildings or areas for improved visual display or to reduce lighting costs. In addition, light emitting pixel arrays may be used to project media facades for decorative motion or video effects. In conjunction with tracking sensors and/or cameras, selective illumination of areas around pedestrians may be possible. Spectrally distinct pixels may be used to adjust the color temperature of lighting, as well as support wavelength specific horticultural illumination.

Street lighting is an important application that may greatly benefit from use of light emitting pixel arrays. A single type of light emitting array may be used to mimic various street light types, allowing, for example, switching between a Type I linear street light and a Type IV semicircular street light by appropriate activation or deactivation of selected pixels. In addition, street lighting costs may be lowered by adjusting light beam intensity or distribution according to environmental conditions or time of use. For example, light intensity and area of distribution may be reduced when pedestrians are not present. If pixels of the light emitting pixel array are spectrally distinct, the color temperature of the light may be adjusted according to respective daylight, twilight, or night conditions.

Light emitting arrays are also well suited for supporting applications requiring direct or projected displays. For example, warning, emergency, or informational signs may all be displayed or projected using light emitting arrays. This allows, for example, color changing or flashing exit signs to be projected. If a light emitting array is composed of a large number of pixels, textual or numerical information may be presented. Directional arrows or similar indicators may also be provided.

Various other adaptations and combinations of features of the embodiments disclosed are within the scope of the invention. Numerous embodiments are encompassed by the following claims.

The invention claimed is:

1. A light-emitting device package, comprising:
   a metalized substrate, comprising:
      a top surface;
      pads on the top surface; and
      traces extending from the pads to a perimeter of the top surface;
   a light-emitting diode (LED) die comprising junctions mounted on the pads, the junctions being individually addressable through the traces; and
   a single primary optic over the LED die.

2. The package of claim 1, wherein the primary optic comprises an overmolded silicone lens, an overmolded glass lens, a preformed silicone lens, or a preformed glass lens.

3. The package of claim 1, wherein the junctions emit different colors of light.

4. The package of claim 3, wherein the junctions have different bandgap energies.

5. The package of claim 3, wherein the LED die further comprises individual wavelength converters each located over a different junction.

6. The package of claim 1, wherein:
   the junctions have a common electrode of one polarity and individual electrodes of an opposite polarity;

each of the common electrode and the individual electrodes is mounted on a different pad; and
each trace is connected to a different pad.

7. The package of claim 1, wherein:
the junctions have individual cathodes and individual anodes each mounted on a different pad; and
pads of one polarity connect to a same trace and pads of an opposite polarity connect to individual traces.

8. The package of claim 1, wherein:
the junctions have individual cathodes and individual anodes each mounted on a different pad; and
each trace is connected to a different pad.

9. The package of claim 1, wherein the metalized substrate comprises:
one or more vias connected to one or more pads; and
one or more traces connected to the one or more vias under the top surface.

10. The package of claim 1, wherein a trace to an inner pad passes between outer pads.

11. The package of claim 1, wherein:
the metalized substrate includes:
a first row of first pads;
a second row of second pads;
first traces fanning out from the first pads to the perimeter of the metalized substrate along a first direction and a second direction; and
second traces fanning out from the second pads to the perimeter of the metalized substrate;
at least one second trace passes between neighboring first pads along the first direction; and
at least another second trace passes between neighboring first pad and second pad along the second direction.

12. The package of claim 11, wherein:
the metalized substrate includes:
a third row of third pads; and
third traces fanning out from the third pads to the perimeter of the metalized substrate;
at least one third trace passes between neighboring second pads and neighboring first pads along the first direction; and
at least another third trace passes between neighboring second pad and third pad along the second direction.

13. The package of claim 1, wherein:
the pads include a first row of first pads, a second row of second pads, a third row of third pads, and a fourth row of fourth pads; and
the traces include:
first traces fanning out from the first pads to the perimeter of the metalized substrate in a first direction;
second traces fanning out from the second pads to the perimeter of the metalized substrate, the second traces passing between the first pads along the first direction;
fourth traces fanning out from the fourth pads to the perimeter of the metalized substrate along a second direction; and
third traces fanning out from the third pads to the perimeter of the metalized substrate, the third traces passing between the fourth traces along the second direction.

14. A light-emitting device package, comprising:
a metalized substrate, comprising:
a top surface;
pads on the top surface; and
traces extending from the pads;
a light-emitting diode (LED) die mounted on the substrate, the LED die comprising junctions of different colors mounted on the pads, the junctions being at least partially electrically insulated from each other in the die, the junctions being arranged in an interspersed color pattern; and
a single primary optic over the LED die.

15. The package of claim 14, wherein the LED die further comprises individual wavelength converters each located over a different junction.

16. The package of claim 15, wherein:
the wavelength converters comprise cool-white and warm-white phosphor layers; and
the interspersed color pattern comprises a checkerboard pattern.

17. The package of claim 14, wherein the traces connect the junctions in segments, each segment comprising junctions of a same color connected in series or in parallel.

18. The package of claim 14, wherein the substrate further comprises a bottom surface, bottom pads on the bottom surface, and vias connecting the traces to the bottom pads.

19. A method to produce a light-emitting device package, comprising:
providing a light-emitting diode (LED) die comprising junctions;
providing a metalized substrate comprising:
a top surface;
pads on the top surface; and
traces extending from the pads to a perimeter of the top surface; and
mounting the LED die on the metalized substrate, including mounting the junctions on the pads, the junctions being individually addressable through the traces;
providing a single primary optic over the LED die.

20. The method of claim 19, wherein said providing a primary optic comprises overmolding a silicone or glass lens over the segments or attaching a preformed silicone or glass lens over the segments.

21. The method of claim 19, wherein the junctions emit different colors of light.

22. The method of claim 21, further comprising forming the LED die, including forming the junctions with different bandgap energies.

23. The method of claim 21, further comprising forming the LED die, including forming individual wavelength converters each located over a different junction.

24. The method of claim 23, further comprising forming the LED die, including forming the junctions in an interspersed pattern.

25. The method of claim 24, wherein:
the wavelength converters comprise cool-white and warm-white phosphor layers; and
the interspersed color pattern comprises a checkerboard pattern.

26. The method of claim 19, further comprising forming the LED die, including forming the junctions have a common electrode of one polarity and individual electrodes of an opposite polarity, wherein:
said mounting the LED die on the pads comprises each of the common electrode and the individual electrodes is mounted on a different pad; and
each trace is connected to a different pad so the junctions in the LED die are addressable individually.

27. The method of claim 19, further comprising forming the LED die, including forming the junctions have individual cathodes and individual anodes each mounted on a different pad, wherein:

said mounting the LED die on the pads comprises the junctions have individual cathodes and individual anodes each mounted on a different pad; and pads of one polarity connect to a same trace and pads of an opposite polarity connect to individual traces so the junctions in the LED die are addressable individually.

28. The method of claim 19, further comprising forming the LED die, including forming the junctions have individual cathodes and individual anodes, wherein:
said mounting the LED die on the pads comprises the individual cathodes and the individual anodes each mounted on a different pad; and
each trace is connected to a different pad so the junctions in the LED die are addressable individually.

29. The method of claim 19, wherein the metalized substrate comprises:
one or more vias connected to one or more pads; and
one or more traces connected to the one or more vias under the top surface.

30. The method of claim 19, wherein a trace to an inner pad passes between outer pads.

31. The method of claim 19, wherein:
the metalized substrate includes:
a first row of first pads;
a second row of second pads;
first traces fanning out from the first pads to the perimeter of the metalized substrate along a first direction and a second direction; and
second traces fanning out from the second pads to the perimeter of the metalized substrate;
at least one second trace passes between neighboring first pads along the first direction; and
at least another second trace passes between neighboring first pad and second pad along the second direction.

32. The method of claim 31, wherein:
the metalized substrate includes:
a third row of third pads; and
third traces fanning out from the third pads to the perimeter of the metalized substrate;
at least one third trace passes between neighboring second pads and neighboring first pads along the first direction; and
at least another third trace passes between neighboring second pad and third pad along the second direction.

33. The method of claim 19, wherein:
the pads include a first row of first pads, a second row of second pads, a third row of third pads, and a fourth row of fourth pads; and
the traces include:
first traces fanning out from the first pads to the perimeter of the metalized substrate in a first direction;
second traces fanning out from the second pads to the perimeter of the metalized substrate, the second traces passing between the first pads along the first direction;
fourth traces fanning out from the fourth pads to the perimeter of the metalized substrate along a second direction; and
third traces fanning out from the third pads to the perimeter of the metalized substrate, the third traces passing between the fourth traces along the second direction.

* * * * *